United States Patent
Takeuchi et al.

(10) Patent No.: US 6,483,737 B2
(45) Date of Patent: Nov. 19, 2002

(54) FERROELECTRIC MEMORY DEVICE

(75) Inventors: Yoshiaki Takeuchi, Yokohama (JP);
Sumiko Doumae, Yokohama (JP);
Yukihito Oowaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/956,938

(22) Filed: Sep. 21, 2001

(65) Prior Publication Data

US 2002/0044477 A1 Apr. 18, 2002

(30) Foreign Application Priority Data

Oct. 17, 2000 (JP) ........................................ 2000-316749

(51) Int. Cl.[7] .............................................. G11C 11/22
(52) U.S. Cl. .......................... 365/145; 365/117; 365/149
(58) Field of Search .................................. 365/145, 149, 365/156, 104, 65, 202, 117

(56) References Cited

U.S. PATENT DOCUMENTS

| | | | |
|---|---|---|---|
| 4,888,733 A | | 12/1989 | Mobley |
| 5,309,391 A | * | 5/1994 | Papaliolios ................. 365/145 |
| 5,903,492 A | | 5/1999 | Takashima |
| 5,943,256 A | * | 8/1999 | Shimizu et al. ............. 365/145 |
| 6,046,926 A | * | 4/2000 | Tanaka et al. .............. 365/145 |
| 6,154,387 A | * | 11/2000 | Takata ........................ 365/145 |
| 6,198,652 B1 | * | 3/2001 | Kawakubo et al. ......... 257/295 |

OTHER PUBLICATIONS

D. Takashima et al., "A Sub–40ns Random–Access Chain FRAM Architecture with a 7ns Cell–Plate–Line Drive", ISSCC99/ Session 6/ Paper MP 6.1, pp. 102–103 1999.

* cited by examiner

Primary Examiner—David Nelms
Assistant Examiner—Thong Le
(74) Attorney, Agent, or Firm—Banner & Witcoff, Ltd.

(57) ABSTRACT

A ferroelectric memory device comprises a word line, first and second bit lines cross to the word line, a memory cell including a first transistor a gate of which is coupled to the word line and one of source and drain of which is coupled to the first bit line, a second transistor a gate of which is coupled to the word line and one of source and drain of which is coupled to the second bit line, and a ferroelectric cell capacitor coupled to the other of source and drain of the first and second transistor, and first and second capacitors each coupled via a switching transistor to a respective one of the first and second bit lines, wherein first and second voltages complementary to each other are applied to the first and second bit lines, via the first and second capacitors, respectively.

25 Claims, 17 Drawing Sheets

FERROELECTRIC MEMORY DEVICE

CROSS-REFERENCE TO RELATED APPLICATIONS

This application is based upon and claims the benefit of priority from the prior Japanese Patent Application No. 2000-316749, filed Oct. 17, 2000, the entire contents of which are incorporated herein by reference.

BACKGROUND OF THE INVENTION

The present invention relates to a ferroelectric memory device.

More specifically, the present invention relates to a ferroelectric memory device in which nonvolatile properties of held data has been achieved by a ferroelectric material for a memory cell capacitor.

DESCRIPTION OF THE RELATED ART

Conventionally, there has been developed a ferroelectric memory device employing a ferroelectric material for a memory cell capacitor. Such a ferroelectric memory device requires a shorter time for a write operation as compared with a nonvolatile flash memory. Additionally, the voltage and power consumption have advantageously been lowered. However, the following problems have arisen with a conventionally proposed ferroelectric memory device.

FIG. 17 shows an exemplary configuration of a conventional ferroelectric memory device having a 2T2C type cell structure. In the case of this ferroelectric memory device, a memory cell MC (per bit) include two MOS transistors (M) and two ferroelectric capacitors (C). Thus, there is a problem that a cell area is increased.

FIG. 18 shows an exemplary configuration of a conventional ferroelectric memory device having a 1T1C type cell structure. In the ferroelectric memory device, a memory cell MC (per bit) include one MOS transistor (M) and one ferroelectric capacitor (C). Thus, a memory cell area of this structure is smaller than a memory cell area of the above described 2T2C type cell structure. However, there has been a problem that a reference potential (RPL) is required, and its design is difficult.

In addition, a large capacity cell plate drive line (PL) is provided in a conventional ferroelectric memory device, thus requiring a large driver circuit for driving the cell plate drive line. Occasionally, the area of this driver circuit has consumed about 15% of the chip size.

In recent years, there is proposed a ferroelectric memory having a plurality of unit cells coupled in series (hereinafter, referred to as a TC parallel unit serial connection type ferroelectric memory device). Each unit cell is configured so as to couple electrodes at both ends of a capacitor (C) between a source and a drain of a cell transistor (T), respectively.

FIG. 19 shows an exemplary configuration (cell structure) of a conventional TC parallel unit serial connection type ferroelectric memory device. In the figure, the electrodes of the ferroelectric capacitor C are coupled to the source and drain of an NMOS transistor M, respectively, to configure a memory cell MC. Then, a configuration is provided such that a plurality of the memory cells MC are coupled in series.

However, in the TC parallel unit serial connection type ferroelectric memory device, a memory cell MC (for example, MC7 and MC7'), proximal to cell plate drive lines PL and /PL, has respective different antenna ratios at both ends of the ferroelectric capacitor C. That is, the wire length between memory cells MC7 and MC7' and adjacent memory cells MC6 and MC6' is in the order of micrometers. In contrast, the cell plate drive lines PL and /PL have wire lengths in the order of millimeters. Because of this, for example, if a high voltage static electricity is applied to the outside of a chip when the power is turned OFF, there occurs a difference in potential induced between both electrodes of the ferroelectric capacitor C of the memory cells MC7 and MC7'. As a result, a high voltage is temporarily applied to the ferroelectric capacitor C of the memory cells MC7 and MC7', which could cause data destruction or lowered signal strength.

BRIEF SUMMARY OF THE INVENTION

According to an embodiment of the present invention, there is provided a ferroelectric memory device comprising: a word line; first and second bit lines cross to the word line; a memory cell including a first transistor a gate of which is coupled to the word line and one of source and drain of which is coupled to the first bit line, a second transistor a gate of which is coupled to the word line and one of source and drain of which is coupled to the second bit line, and a ferroelectric cell capacitor coupled to the other of source and drain of the first and second transistor; and first and second capacitors each coupled via a switching transistor to a respective one of the first and second bit lines; wherein first and second voltages complementary to each other are applied to the first and second bit lines, via the first and second capacitors, respectively.

According to an embodiment of the present invention, there is provided a ferroelectric memory device, comprising a plurality of word lines, first and second bit lines cross to the plurality of word lines, cell blocks each including a plurality of memory cells coupled in series and each including a plurality of transistors whose gate is coupled to a respective one of the plurality of word lines, and a plurality of ferroelectric cell capacitors coupled between the source and drain of the plurality of transistors, respectively, one end of the series-coupled memory cells being coupled to the first bit line, and the other end thereof being coupled to the second bit line; and first and second capacitors coupled to the first and second bit lines, respectively, via a switching transistor, wherein first and second voltages complementary to each other are applied to the first and second bit lines via the first and second capacitors, respectively.

According to an embodiment of the present invention, there is provided a ferroelectric memory device, comprising a plurality of memory cells coupled in series and including a plurality of cell transistors whose gate is coupled to a respective one of a plurality of word lines and a plurality of ferroelectric cell capacitors coupled between the source and drain of the plurality of cell transistors, respectively, and wherein one end of the plurality of memory cells is coupled to a bit line, and the other end thereof is coupled to a plate line, the plurality of cell transistor being configured by a depression type NMOS transistor.

According to an embodiment of the present invention, there is provided a ferroelectric memory device, comprising a plurality of memory cells coupled in series and including a plurality of cell transistors whose gate is coupled to a respective one of a plurality of word lines and a plurality of ferroelectric cell capacitors coupled between the source and drain of the plurality of cell transistors, respectively, and wherein one end of the plurality of memory cells is coupled to a bit line, and the other end thereof is coupled to a plate line, the plurality of cell transistor being configured by a PMOS transistor.

According to an embodiment of the present invention, there is provided a ferroelectric memory device, comprising one end of a memory cell including a cell transistor and a ferroelectric cell capacitor coupled to the cell transistor being coupled to a bit line, and the other end thereof being coupled to a plate line, a protective transistor being provided between the other end of the memory cell and the plate line.

According to an embodiment of the present invention, there is provided a ferroelectric memory device, comprising a plurality of memory cells coupled in series and including a plurality of cell transistors whose gate is coupled to a respective one of a plurality of word lines and a plurality of ferroelectric cell capacitors coupled between the source and drain of the plurality of cell transistors, respectively, and wherein one end of the plurality of memory cells is coupled to a bit line, and the other end thereof is coupled to a plate line, a protective transistor being provided between the other end of the plurality of memory cells and the plate line.

According to an embodiment of the present invention, there is provided a ferroelectric memory device, comprising a plurality of memory cells coupled in series and including a plurality of cell transistors whose gate is coupled to a respective one of a plurality of word lines and a plurality of ferroelectric cell capacitors coupled between the source and drain of the plurality of cell transistors, respectively, and wherein one end of the plurality of memory cells is coupled to a bit line, and the other end thereof is coupled to a plate line, and an electrostatic barrier layer including an electrically conductive layer provided above the plurality of ferroelectric cell capacitors.

According to an embodiment of the present invention, there is provided a ferroelectric memory device, comprising a plurality of memory cells coupled in series and including a plurality of cell transistors whose gate is coupled to a respective one of a plurality of word lines and a plurality of ferroelectric cell capacitors coupled between the source and drain of the plurality of cell transistors, respectively, and wherein one end of the plurality of memory cells is coupled to a bit line, and the other end thereof is coupled to a plate line, and a plurality of electrostatic barrier layers each including an electrically conductive layer and provided above the plurality of ferroelectric cell capacitors.

DETAILED DESCRIPTION OF THE INVENTION

Embodiments of the present invention will be described in further detail with reference to the accompanying drawings.
(First Embodiment)

Figure 1:
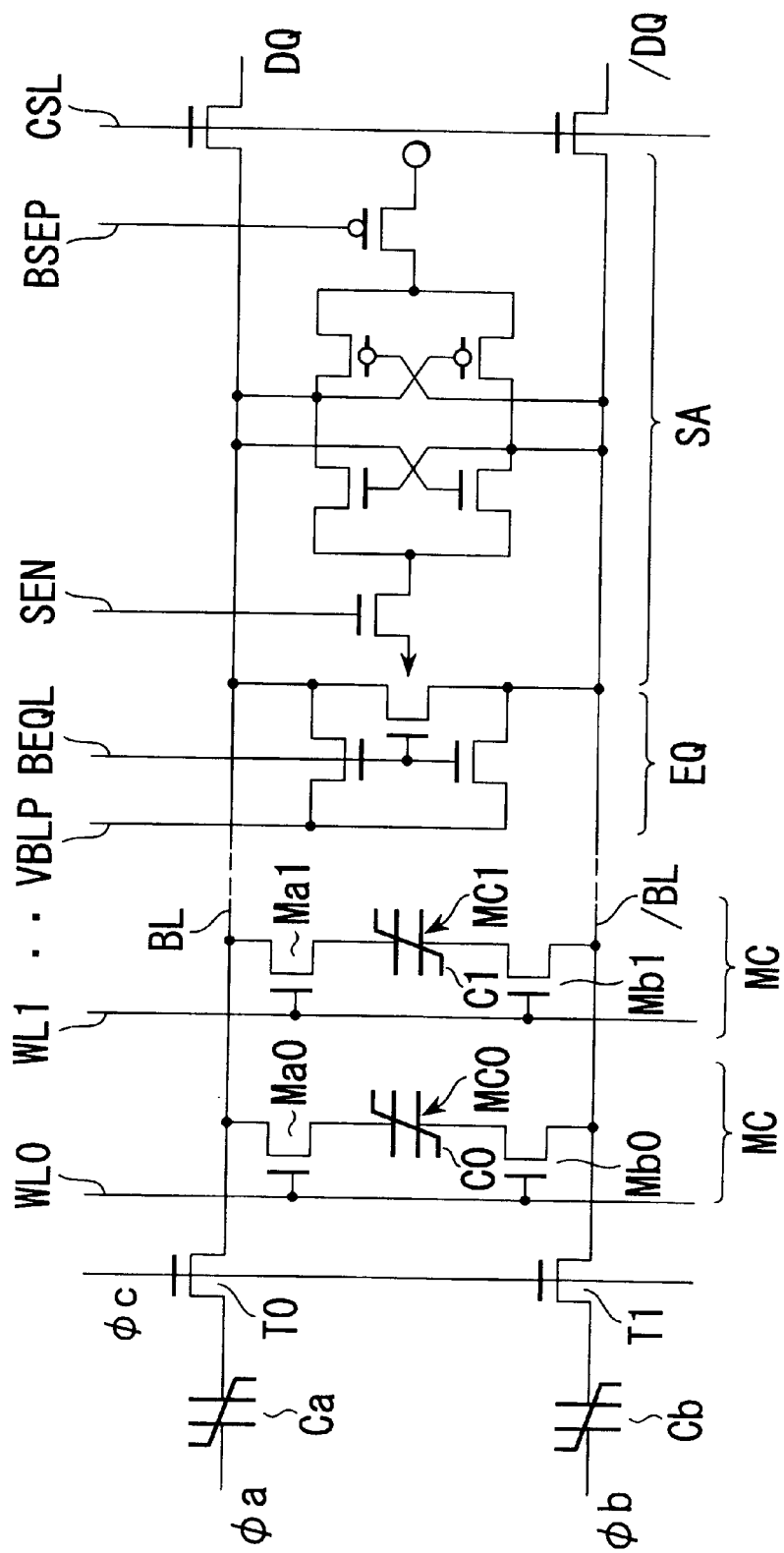
FIG. 1 is a circuit diagram showing an exemplary configuration of a ferroelectric memory device according to a first embodiment of the present invention.

FIG. 1 shows an exemplary configuration of a ferroelectric memory device according to a first embodiment of the present invention. In the case of ferroelectric memory device, a memory cell MC has a 2T1C type cell structure. That is, the memory cell MC includes two enhancement type NMOS transistors Ma and Mb per bit and one ferroelectric capacitor (cell capacitor) C.

For example, in a memory cell MC0, the gates of the enhancement type NMOS transistors Ma0 and Mb0 are each coupled to a word line WL0. One electrode (drain) of the NMOS transistor Ma0 is coupled to a first bit line BL. The other electrode (source) is coupled to one electrode of a ferroelectric capacitor C0. One electrode (drain) of the NMOS transistor Mb0 is coupled to a second bit line /BL. The other electrode (source) is coupled to the other electrode of the ferroelectric capacitor C0.

Similarly, for example, in a memory cell MC1 the gates of the enhancement type NMOS transistors Ma1 and Mb1 are each coupled to a word line WL1. One electrode (drain) of the NMOS transistor Ma1 is coupled to a first bit line BL. The other electrode (source) is coupled to one electrode of a ferroelectric capacitor C1. One electrode (drain) of the NMOS transistor Mb1 is coupled to a second bit line /BL. The other electrode (source) is coupled to the other electrode of the ferroelectric capacitor C1.

Of the complementary to each other bit lines BL and /BL, an enhancement type NMOS switch (switching transistor) T0 is coupled to the bit line BL. A ferroelectric capacitor (first capacitor) Ca is coupled to the NMOS switch T0. A clock signal φa is supplied to the capacitor Ca. An enhancement type NMOS switch (switching transistor) T1 is coupled to the bit line /BL. A ferroelectric capacitor (second capacitor) Cb is coupled to the NMOS switch T1. A clock signal φb is supplied to the capacitor Cb. The above NMOS switches T0 and T1 are controlled by means of a clock signal φc supplied to each gate.

In addition, an equalizer circuit EQ for equalizing bit lines BL and /BL and a sense amplifier SA for sensing a potential difference between the bit lines BL and /BL are provided between the above bit lines BL and /BL. DQ and /DQ are data lines coupled to bit lines BL and /BL, respectively.

Figure 2:
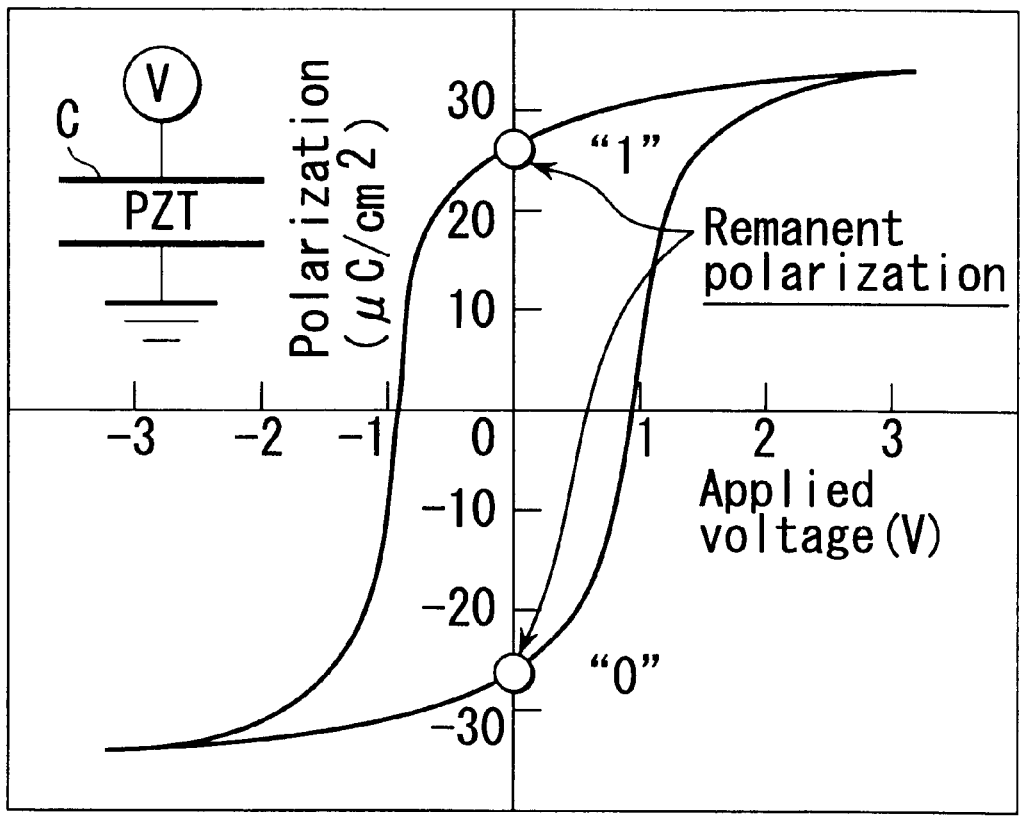
FIG. 2 is a characteristic view showing a hysteresis curve of a ferroelectric cell capacitor in the ferroelectric memory device shown in FIG. 1.
Figure 3:
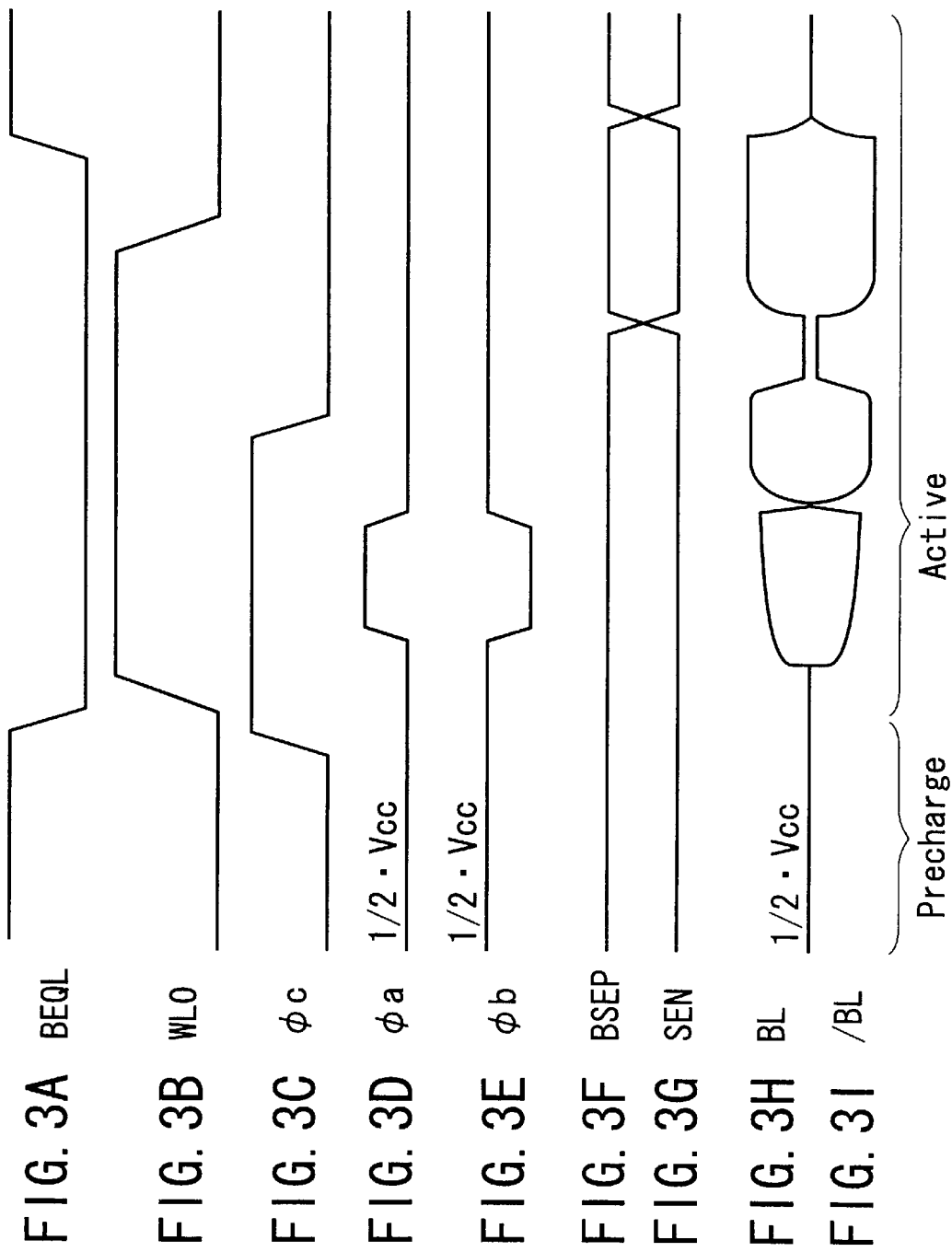
FIGS. 3A to 3I are timing charts each illustrating an exemplary operation of the ferroelectric memory device shown in FIG. 1.

Now, a ferroelectric capacitor C will be briefly described with reference to a hysteresis curve shown in FIG. 2. For example, as a ferroelectric capacitor film, a PZT (lead zirconate/titanate (Pb (Zr, Ti) O$_3$)) film is employed.

In the PZT film, while no voltage is applied, there exists a remanent polarization in any of the upward and downward directions indicated by "0" and "1" in the figure, and nonvolatile properties are obtained. In this state, assume that a voltage is applied. In the case where remanent polarization is set to "1", such remanent polarization is not inverted. On the other hand, in the case where remanent polarization is set to "0", such remanent polarization is inverted. Polarization required to apply the same voltage are different from each other depending on whether remanent polarization is set to "0" or "1". In other words, depending on whether remanent polarization is set to "0" or "1", when the same voltage is applied to one end (one electrode) of the ferroelectric capacitor C, there occurs a difference in polarization generated at the other end (the other electrode). Data is read out by sensing this difference.

Now, an operation of a ferroelectric memory device having its configuration shown in FIG. 1 will be described with reference to FIGS. 3A to 3I.

In a precharge state, the potentials of the bit lines BL and /BL are set to ½·Vcc, and clock signals φa and φb are both set to ½·Vcc.

On the other hand, in an active state, for example, a word line WL0 is set to a pressure rise potential. In this manner, NMOS transistors Ma0 and Mb0 of the memory cell MC0 are each electrically coupled to a respective one of the bit lines BL and /BL. At this time, a clock signal φc is set to "H", and MOS switches T0 and T1 are turned ON. Further, clock signals φa and φb are controlled via the ferroelectric capacitors Ca and Cb as follows.

Firstly, the clock signal φa is set from ½·Vcc to "H", and the clock signal φb is set from ½·Vcc to "L". Then, a potential of the bit line BL is lifted from a precharge level to "H" via a capacitor Ca. At the same time, a potential of the bit line /BL is reduced to "L" via a capacitor Cb. As a result, a downward electric field is applied to a ferroelectric capacitor C0. This makes it possible to read out data "0" from the memory cell MC0.

Secondly, the clock signal φa is set from "H" to ½·Vcc, and the clock signal φb is set from "L" to ½·Vcc. Then, the potential of the bit line BL is reduced from "H" to "L" via the capacitor Ca. At the same time, the potential of the bit line BL is lifted from "L" to "H" via the capacitor Cb. As a result, an upward electric field is applied to the ferroelectric capacitor C0. This makes it possible to read out data "1" from the memory cell MC0.

Thirdly, a clock signal φc is set to "L", and the MOS switches T0 and T1 are turned OFF. Then, the capacitors Ca and Cb are electrically disconnected from the bit lines BL and /BL.

Fourthly, a sense amplifier SA is activated by controlling a signal SEN. Then, a potential difference between the bit lines BL and /BL is sensed by means of the sense amplifier SA, and data is read out. In addition, data is rewritten at the same time.

Fifthly, a word line WL0 is deactivated. In this manner, the bit lines BL and /BL and the memory cell MC0 are electrically disconnected from each other.

In this manner, a ferroelectric capacitor C is coupled to bit lines BL and /BL via a respective one of the NMOS transistors Ma and Mb. In addition, the ferroelectric capacitor C is complementarily subjected to a capacity coupling operation. Doing this makes it possible to read and write data relevant to the memory cell MC by applying a voltage to the bit lines BL and /BL.

Unlike the conventional case of data reading/writing, there is no need for the cell plate drive line to operate in a pulse manner. Therefore, a cell plate drive line and a large driver circuit for driving the drive line are eliminated. This makes it possible to reduce the chip area.

In addition, a memory cell MC with a 2T1C type cell structure is provided, thereby making it possible to reduce a cell area as compared with a conventional memory cell with a 2T2C type cell structure. Although one more transistor is required as compared with the memory cell with 1T1C type cell structure, the complexity in designing a reference potential is eliminated. Moreover, in the case of a memory cell with a 1T1C type cell structure, the data readout polarization is about ½ of the memory cell of the 2T2C type cell structure. A memory cell MC with a 2T1C type cell structure is provided, thereby making it possible to ensure the read polarization is equivalent to the memory cell with the 2T2C type cell structure.

(Second Embodiment)

Figure 4:
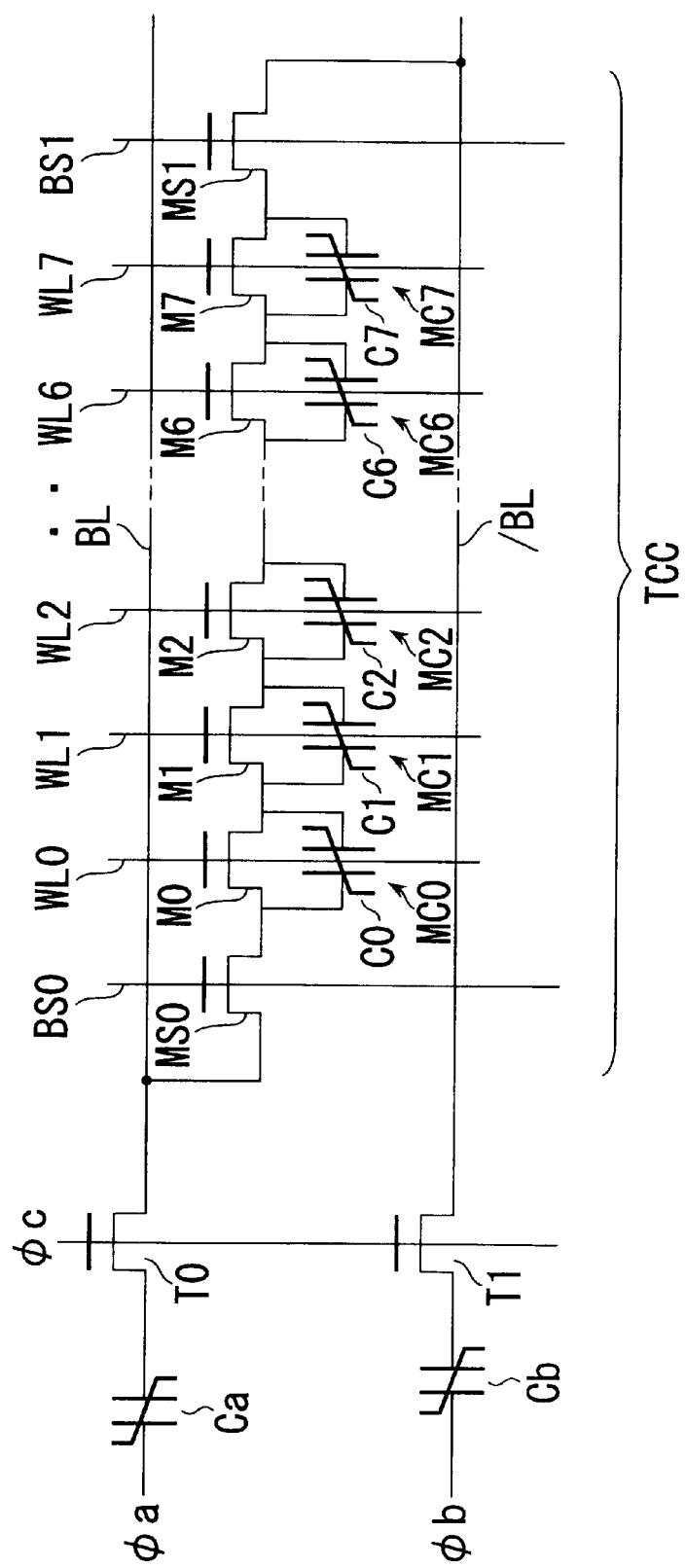
FIG. 4 is a circuit configuration showing an exemplary cell structure of a TC parallel unit serial connection type ferroelectric memory device according to a second embodiment of the present invention.

FIG. 4 shows an exemplary configuration (cell structure) of a TC parallel unit serial connection type ferroelectric memory device according to a second embodiment of the present invention.

In the case of TC parallel unit serial connection type ferroelectric memory device, memory cells MC0 to MC7 are each configured so that electrodes at both ends of the ferroelectric capacitors (cell capacitors) C0 to C7 are coupled to the source and drain of NMOS transistors M0 to M7, respectively. In addition, the plurality of memory cells MC0 to MC7 are coupled in series, whereby a TC parallel unit serial connection type cell (cell block) TCC is configured. Further, a cell MC0 at one end of the TC parallel unit serial connection type cell TCC is coupled to one bit line (first bit line) BL via an enhancement type MOS switch (block select transistor) MS0. Furthermore, a cell MC7 at the other end is coupled to the other bit line (second bit line) /BL via an enhancement type MOS switch (block select transistor) MS1.

A ferroelectric capacitor (first capacitor) Ca is coupled to the bit line /BL via an enhancement type NMOS switch (switching transistor) T0. A clock signal φa is supplied to the capacitor Ca. A ferroelectric capacitor (second capacitor) Cb is coupled to the bit line /BL via an enhancement type NMOS switch (switching transistor) T1. A clock signal φb is supplied to the capacitor Cb. The above NMOS switches T0 and T1 are controlled by means of a clock signal φc supplied to each gate.

A TC parallel unit serial connection type ferroelectric memory device with such a configuration makes it possible to carry out operations that are substantially similar to the ferroelectric memory device shown in the above described first embodiment.

Here, in a conventional ferroelectric memory device (hereinafter, referred to as a publicly known example) disclosed in U.S. Pat. No. 5,903,492, for example, a potential of bit line BLH is increased, and a potential of bit line BLL is reduced from among bit line pairs BLL and BLH. Thus, a potential difference is provided to the bit line pairs BLL and BLH, thereby setting the bit lines to a floating state. In this state, a potential of a block select line is increased, and a bit line is made conductive. By doing this, data is read out.

In this readout system, in the case where remanent polarization is oriented from the bit line BLH to the bit line BLL (in this case, "0" is set in the publicly known ferroelectric memory device of the publicly known example), no inversion of remanent polarization occurs. Therefore, a small amount of charge is read out from the bit line pairs BLL and BLH. Conversely, in the case where remanent polarization is oriented from the bit line BLL to the bit line BLH (in this case, "1" is set in the publicly known ferroelectric memory device), inversion of remanent polarization occurs. Therefore, a large amount of charge is read out.

In a conventional TC parallel unit serial connection type ferroelectric memory device, a difference between these charges is compared with a certain reference potential. By doing this, data is read out (refer to FIGS. 84 and 86, for example, for a publicly known example).

In contrast, in a TC parallel unit serial connection type ferroelectric memory according to the present embodiment, positive and negative potentials are applied by means of capacity coupling to ferroelectric capacitors C0 to C7 coupled to a bit line set to a floating state. This makes it possible to always cause inversion of remanent polarization. Then, a potential difference between the bit lines BL and /BL are sensed. In this way, a signal quantity can be increased by always causing inversion of remanent polarization. In addition, it is possible to directly read out and sense a potential difference between the bit lines BL and /BL. As a result, as is evident from FIGS. 3A to 3I, a data readout margin can be broadened.

Any of the above described first and second embodiments has described a case in which the capacitors Ca and Cb are configured by a ferroelectric capacitor. The capacitors Ca and Cb can be configured by an ordinary dielectric capacitor, for example, without being limited thereto. However, the ferroelectric capacitor is the same as the ordinary dielectric capacitor in size, and is greater in capacitance.

In addition, in the case where a ferroelectric capacitor is employed for capacitors Ca and Cb, it is desirable that the film thickness of the ferroelectric film is formed to be thicker than that of the ferroelectric capacitor C of the memory cell MC. In such a case, remanent polarization of the capacitors Ca and Cb is not completely inverted. Thus, the capacitors Ca and Cb are operated in a capacity applied voltage (V) range, thereby making it possible to use them as ordinary dielectric capacitors. By doing this, the fatigue of remanent polarization inversion of the capacitors Ca and Cb can be reduced, making it possible to improve chip reliability.

(Third Embodiment)

Figure 5:
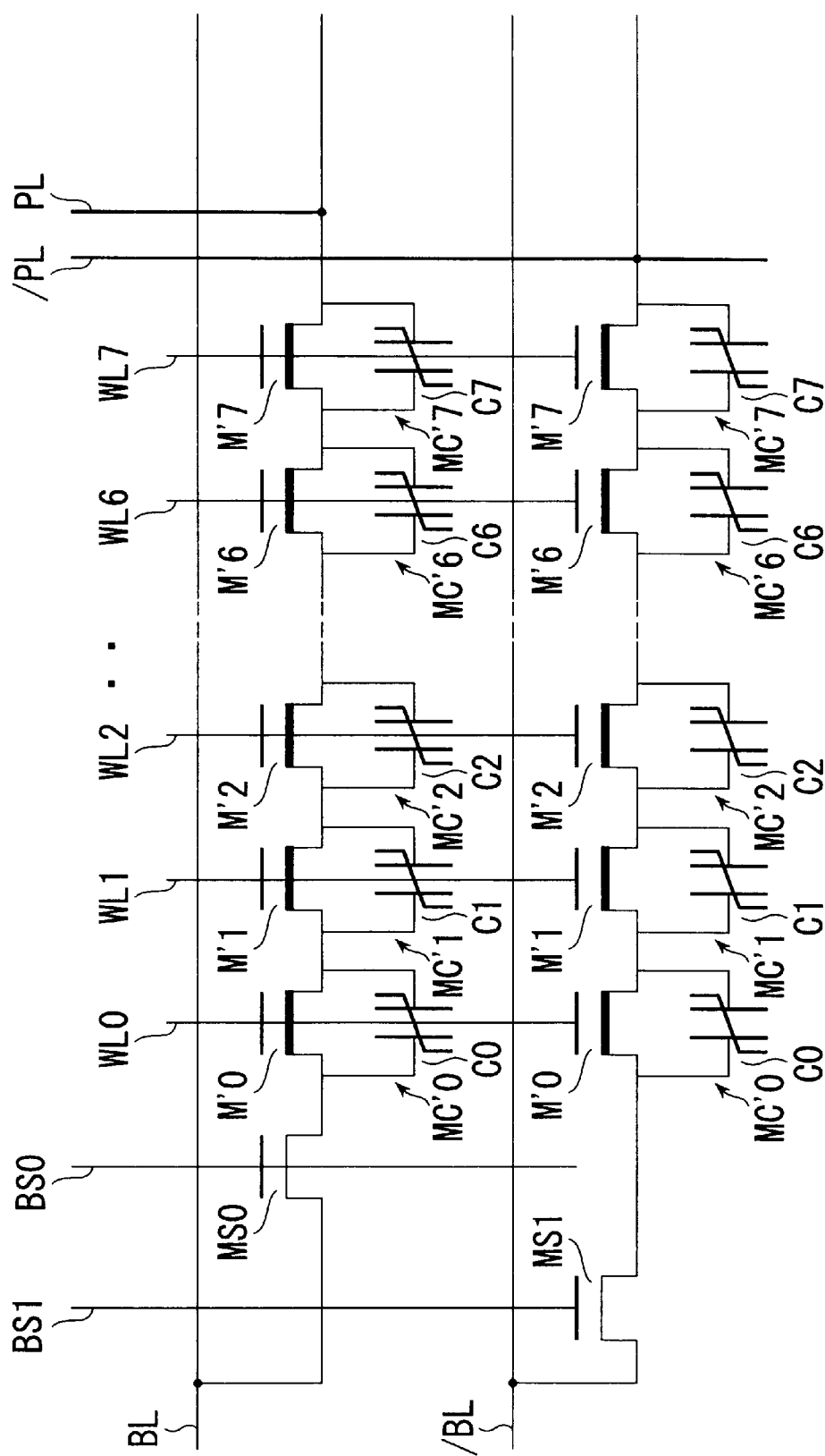
FIG. 5 is a circuit configuration showing an exemplary cell structure of a TC parallel unit serial connection type ferroelectric memory device according to a third embodiment of the present invention.

FIG. 5 shows an exemplary configuration (cell structure) of a TC parallel unit serial connection type ferroelectric memory device according to a third embodiment of the present invention. Now, a description will be given by way of showing an example when the present invention is applied to a TC parallel unit serial connection type ferroelectric memory device provided at a cross point between a word line and a bit line, respectively, wherein a plurality of ferroelectric memory cells including one transistor and one capacitor are coupled in series (for example, ref. ISSCC Tech. Dig. Papers, pp. 102–103, February 1999, "A sub-40ns Random-Access Chain FRAM Architecture with 7ns Cell-Plate-Line Drive,").

In the case of TC parallel unit serial connection type ferroelectric memory device, memory cells MC'0 to MC'7 are each configured so that electrodes at both ends of ferroelectric capacitors (cell capacitors) C0 to C7 are coupled to the source and drain of NMOS transistors M'0 to M'7 of D type (depression type), respectively. In addition, the plurality of memory cells MC'0 to MC'7 are coupled in series, and TC parallel unit series connection type cells (memory cell arrays) are configured, respectively. Further, cells MC'0 and MC'0 each at one end of a respective one of the TC parallel unit serial connection type cells are coupled to bit lines BL and /BL via a respective one of the MOS switches MS0 and MS1. Furthermore, the cells MC'7 and MC'7, each at the respective end are coupled to the cell plate drive lines PL and /PL.

With such a configuration, when power is turned OFF, it is possible to always maintain a cell transistor (D type NMOS transistors M'0 to M'7) in an ON state. Therefore, even if static electricity or the like is applied from the outside when power is turned OFF, a high voltage can be impeded from being applied to cell capacitors (ferroelectric capacitors C0 to C7).

Here, in a depression type transistor, where a word line is set to a "Lword" level during cell access, it is desired that thresholds are set such that a difference between a word line "Lword" level and a bit line "Lbit" level is VLword-VLbit<Vtcell (Vtcell: threshold of cell transistor). Therefore, in a ferroelectric memory device according to the present embodiment, it is preferable that "VLword" is lower than "VLbit".

(Fourth Embodiment)

Figure 6:
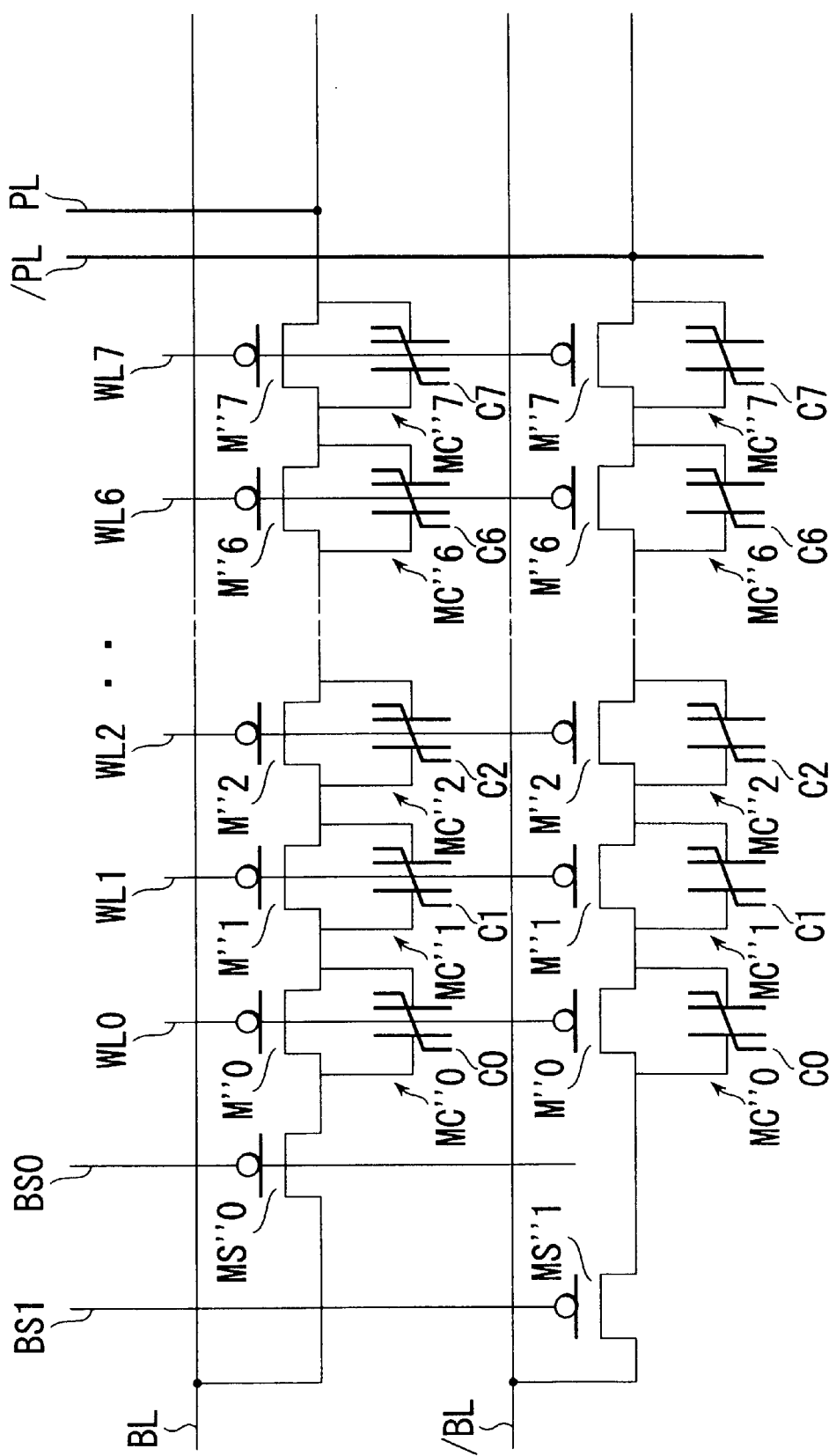
FIG. 6 is a circuit configuration showing an exemplary cell structure of a TC parallel unit serial connection type ferroelectric memory device according to a fourth embodiment of the present invention.

FIG. 6 shows an exemplary configuration (cell structure) of a TC parallel unit serial connection type ferroelectric memory device according to a fourth embodiment of the present invention.

In the case of TC parallel unit serial connection type ferroelectric memory device, memory cells MC"0 to MC"7 are each configured so that electrodes at both ends of ferroelectric capacitors (cell capacitors) C0 to C7 are each coupled to the source and drain of PMOS transistors M" to M"7, respectively. In addition, the plurality of memory cells MC"0 to MC"7 are coupled in series, and TC parallel unit serial connection type cells are configured, respectively. Further, the cells MC"0 and MC"0 each at one end of a respective one of the TC parallel unit serial connection type cells are coupled to the bit lines BL and /BL via a respective one of the MOS switches MS"0 and MS"1 including PMOS transistors. In addition, the cells MC'"7 and MC'"7 each at the respective other end are coupled to cell plate drive lines PL and /PL.

With such a configuration, it is possible to set a cell transistor (PMOS transistors M"0 to M"7) to an ON state. Therefore, even if static electricity is applied from the outside when power is turned OFF, a high voltage can be impeded from reaching cell capacitors (ferroelectric capacitors C0 to C7).

(Fifth Embodiment)

Figure 7:
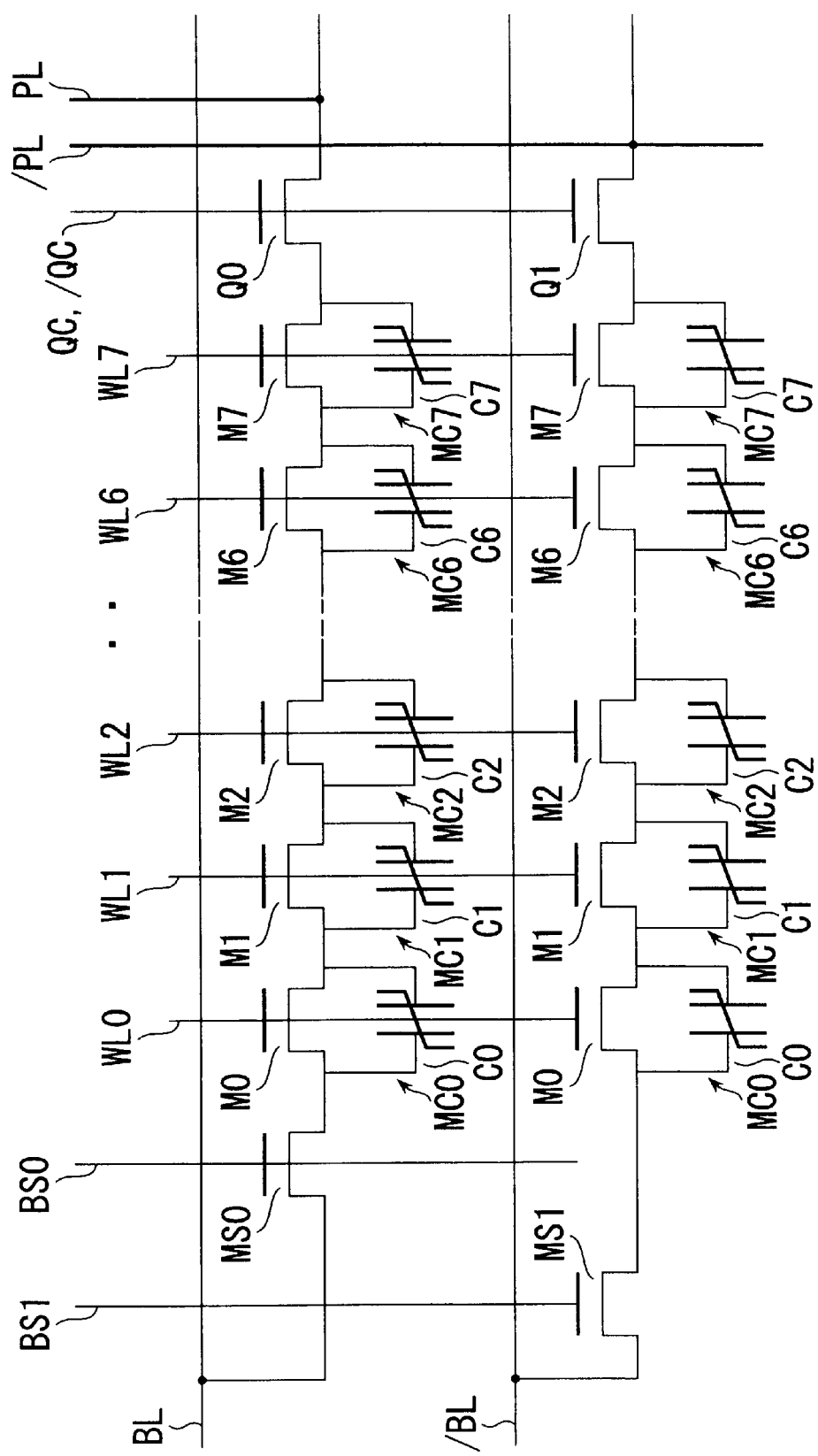
FIG. 7 is a circuit configuration showing an exemplary cell structure of a TC parallel unit serial connection type ferroelectric memory device according to a fifth embodiment of the present invention.

FIG. 7 shows an exemplary configuration (cell structure) of a TC parallel unit serial connection type ferroelectric memory device according to a fifth embodiment of the present invention.

In the case of TC parallel unit serial connection type ferroelectric memory device, memory cells MC0 to MC7 each are configured so that electrodes at both ends of ferroelectric capacitors (cell capacitors) C0 to C7 are coupled to the source and drain of the NMOS transistors M0 to M7, respectively. In addition, the plurality of memory cells MC0 to MC7 are coupled in series, and TC parallel unit serial connection type cells are configured, respectively. Further, cells MC0 and MC0 each at one end of a respective one of the TC parallel unit serial connection type cells are coupled to bit lines BL and /BL via a respective one of the MOS switches MS0 and MS1. In addition, cells MC7 and MC7 of the respective other end are coupled to the cell plate drive lines PL and /PL via a respective one of the NMOS transistors (protective transistors) Q0 and Q1. The above NMOS transistors Q0 and Q1 are controlled to be set to an OFF state via control signal lines QC and /QC, respectively, when power is turned OFF.

With such a configuration, when applying of rapid static electricity or the like occurs, there can be avoided a failure that a high voltage is excessively applied to cell capacitors (ferroelectric capacitors C0 to C7) by way of an ON resistance of the transistors M0 to M7. That is, NMOS transistors Q0 and Q1 are provided between each of the cells MC7 and MC7 of a respective one of the TC parallel unit serial connection type cells and each of the cell plate drive lines PL and PL/. Doing this makes it possible to ensure that the respective antenna ratios of electrodes at both ends of capacitors C7 and C7 are substantially equal to each other. In this manner, even if the cell plate drive lines PL and /PL are induced by way of static electricity when power is turned OFF, a potential substantially equal to electrodes at both ends of the cell capacitors C7 and C7 can be induced.

In this way, in the case where the antenna ratios at both ends of the cells C7 and C7 are substantially equal to each other, even if the cell plate drive lines PL and /PL with their large area are induced by way of static electricity, a high voltage is impeded from being applied to at least the cell capacitors C7 and C7. This makes it possible to prevent data destruction or lowered signal strength caused by the conventional applying of static electricity from the outside when power is turned OFF.

In the present embodiment, control signal lines QC and /QC of transistors Q0 and Q1 are employed as common signals. A signal similar to a select signal line BS0 may be supplied to the transistor Q0, and a signal similar to a select signal line BS1 may be supplied to the transistor Q1. In such a case, cell plate drive lines PL and /PL are employed as one signal line, whereby these drive lines may be coupled to the transistors Q0 and Q1 in common.

In addition, with a configuration according to the present embodiment, thresholds of the MOS switch MS0 and MS1 and the NMOS transistors Q0 and Q1 are set to be higher than those of the other transistors. By doing this, it may be hard to set an ON state. Conversely, the thresholds of the cell transistors M0 to M7 are reduced, whereby the ON state can be easily set. In such a case, even if a high potential is induced by the bit lines BL and /BL or cell plate drive lines PL and /PL, the possibility that a voltage is applied to the cell capacitors C0 to C7 can be lowered more significantly.

(Sixth Embodiment)

Figure 8A:
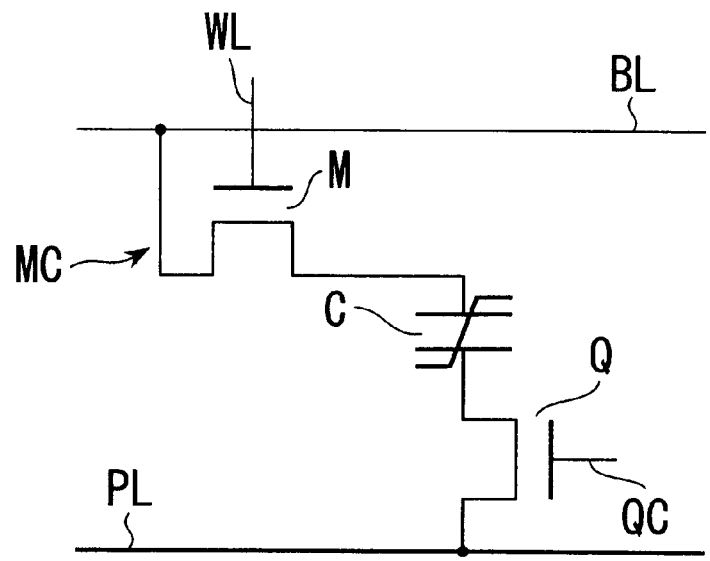
FIGS. 8A and 8B are circuit diagrams each showing an exemplary cell configuration of a ferroelectric memory device according to a sixth embodiment of the present invention.
Figure 8B:
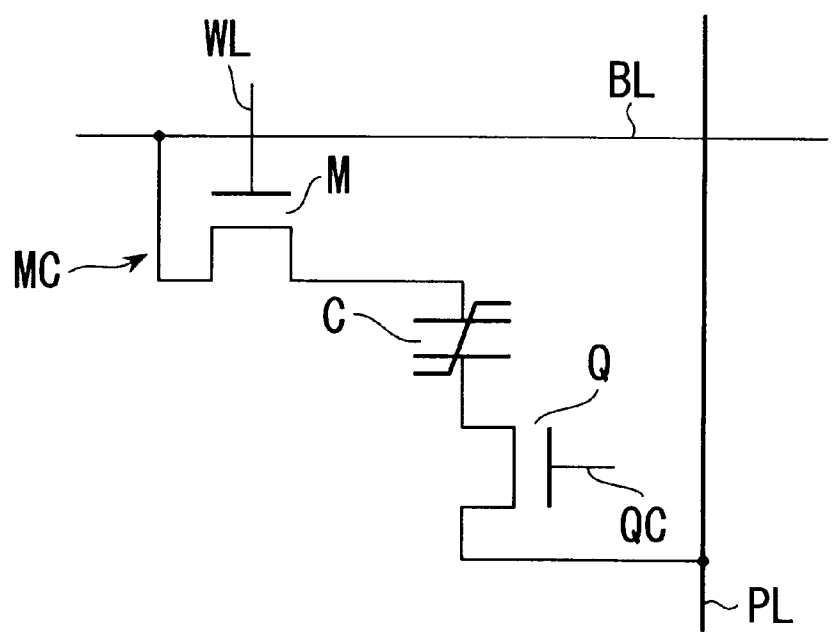

FIGS. 8A and 8B each show an exemplary cell configuration of a ferroelectric memory according to a sixth embodiment of the present invention. Hereinafter, a description will be given with respect to a case in which the invention according to the above described fifth embodiment is applied to a ferroelectric memory device in which a memory cell with a 1T1C type cell structure is provided at a cross point between a word line and a bit line. In addition, FIG. 8A shows an example when the bit line BL and cell plate drive line PL are arranged in a parallel direction. FIG. 8B shows an example when the bit line BL and cell plate drive line PL are arranged in an orthogonal direction.

In the case of ferroelectric memory device, a memory cell MC with a 1T1C type cell structure included one NMOS transistor (cell transistor) M and one ferroelectric capacitor (cell capacitor) C. That is, in the memory cell MC, a gate of a cell transistor M is coupled to a word line WL. One electrode of the cell transistor M is coupled to the bit line BL, and the other electrode is coupled to the other electrode of a capacitor C. In addition, the other electrode of the capacitor C is coupled to a cell plate drive line PL via an NMOS transistor (protective transistor) Q.

With such a configuration, in the memory cell MC with the 1T1C type cell structure as well, as is the case with the above described TC parallel unit serial connection type ferroelectric memory according to the fifth embodiment, it is possible to substantially equalize the antenna ratio of a respective one of the electrodes at both ends of the cell capacitor C. As a result, even if a cell plate drive line PL with a large area is induced by way of static electricity, a high voltage can be impeded from being applied to the cell capacitor C.

A control signal line QC for switching control of the above NMOS transistor Q can be shared with a word line WL. By doing this, the number of signal lines can be reduced, making it possible to provide a finer cell.

In particular, as shown in FIG. 8A, in the case where the bit line BL and cell plate drive line PL are laid out so as to be parallel to each other, the bit line BL and cell plate drive line PL are affected by an external electromagnetic wave similarly. Because of this, a potential equal to both ends of the cell MC is induced. As a result, a voltage of the cell capacitor C can be prevented from being applied. Moreover, in the case where the bit line BL and cell drive line PL are laid out to be parallel to each other, different metal layers are employed for the bit line BL and cell plate drive line PL. By doing this, a sufficient chip area can be obtained without increasing it.

In addition, as shown in FIG. 8B, in the case where the bit line BL and cell plate drive line PL are laid out so as to be orthogonal to each other, the pitches of cells MC are reduced, whereby the chip area can be reduced.

(Seventh Embodiment)

Figure 9:
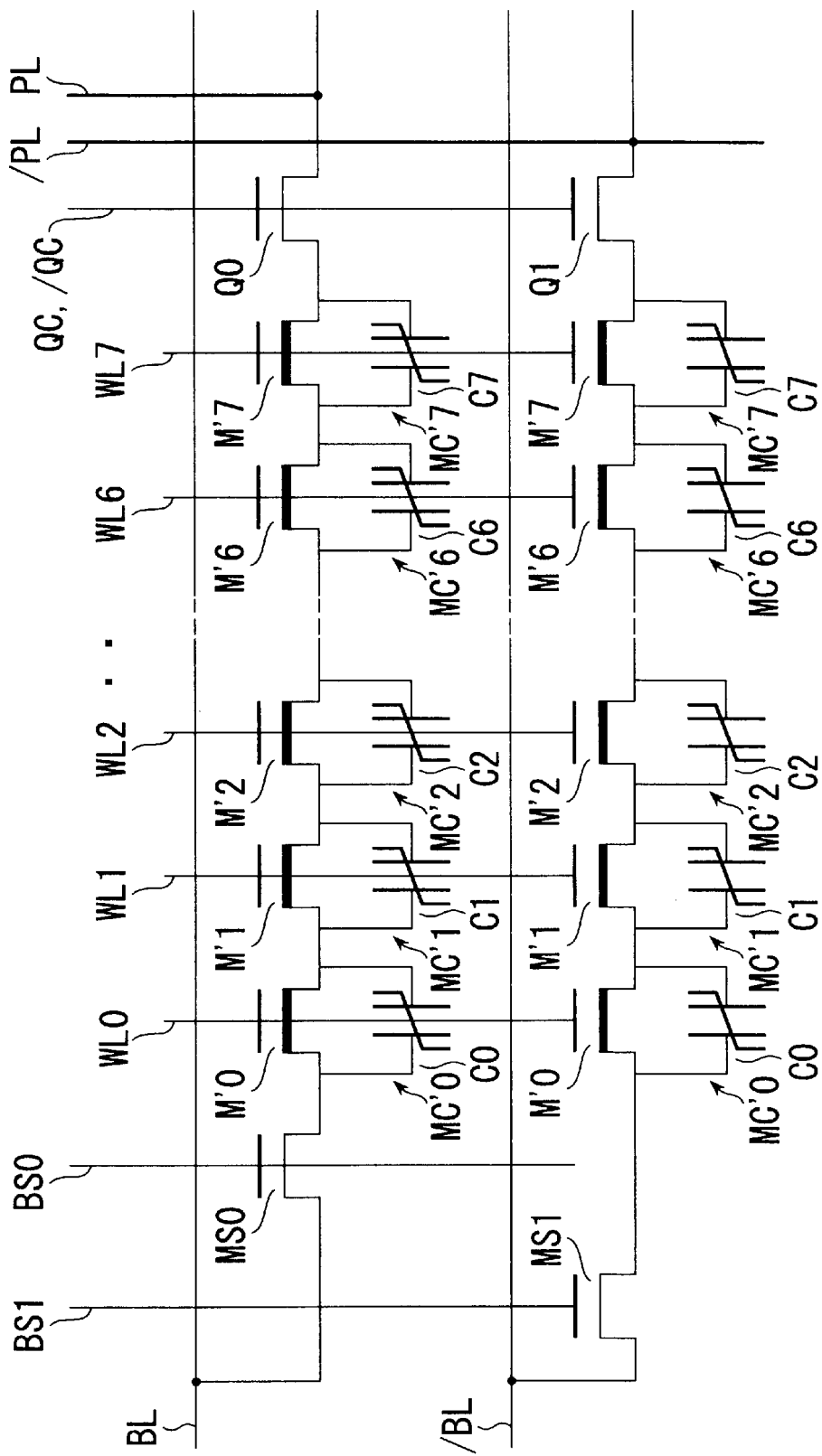
FIG. 9 is a circuit configuration showing an exemplary cell structure of a TC parallel unit serial connection type ferroelectric memory device according to a seventh embodiment of the present invention.

FIG. 9 shows an exemplary configuration (cell structure) of a TC parallel unit serial connection type ferroelectric memory device according to a seventh embodiment of the present invention. Hereinafter, a description will be given with respect to a case in which the above described invention according to the third embodiment is combined with that according to the fifth embodiment.

In the case of this TC parallel unit serial connection type ferroelectric memory device, the memory cells MC'0 to MC'7 each are configured so that the electrodes at both ends of the ferroelectric capacitors (cell capacitors) C0 to C7 are the source and drain of D type NMOS transistors M'0 to M'7, respectively. In addition, the plurality of memory cells MC'0 to MC'7 are coupled in series, and TC parallel unit serial connection type cells are configured, respectively. Further, the cells MC'0 and MC'0 each at one end of a respective one of the TC parallel unit serial connection type cells are coupled to the bit lines BL and /BL via a respective one of the MOS switches MS0 and MS1. In addition, the cells MC'7 and MC'7 each at the respective other end are coupled to the cell plate drive lines PL and /PL via a respective one of the NMOS transistors (protective transistors) Q0 and Q1.

With such a configuration, the advantageous effects of the third embodiment and the fifth embodiment can be expected. Therefore, even if static electricity or the like is applied from the outside when power is turned OFF, a high voltage can be impeded from being applied to cell capacitors (ferroelectric capacitors C0 to C7) more efficiently.

With such a configuration, the thresholds of the MOS switches MS0 and MS1 and the NMOS transistors Q0 and Q1 are set to be higher than those of any other transistor. In this way, it may be hard to set an ON state. In such a case, even if a high potential is induced by means of bit lines BL and /BL or cell plate drive lines PL and /PL, the possibility that a voltage is applied to cell capacitors C0 to C7 can be lowered more significantly.

(Eighth Embodiment)

Figure 10:
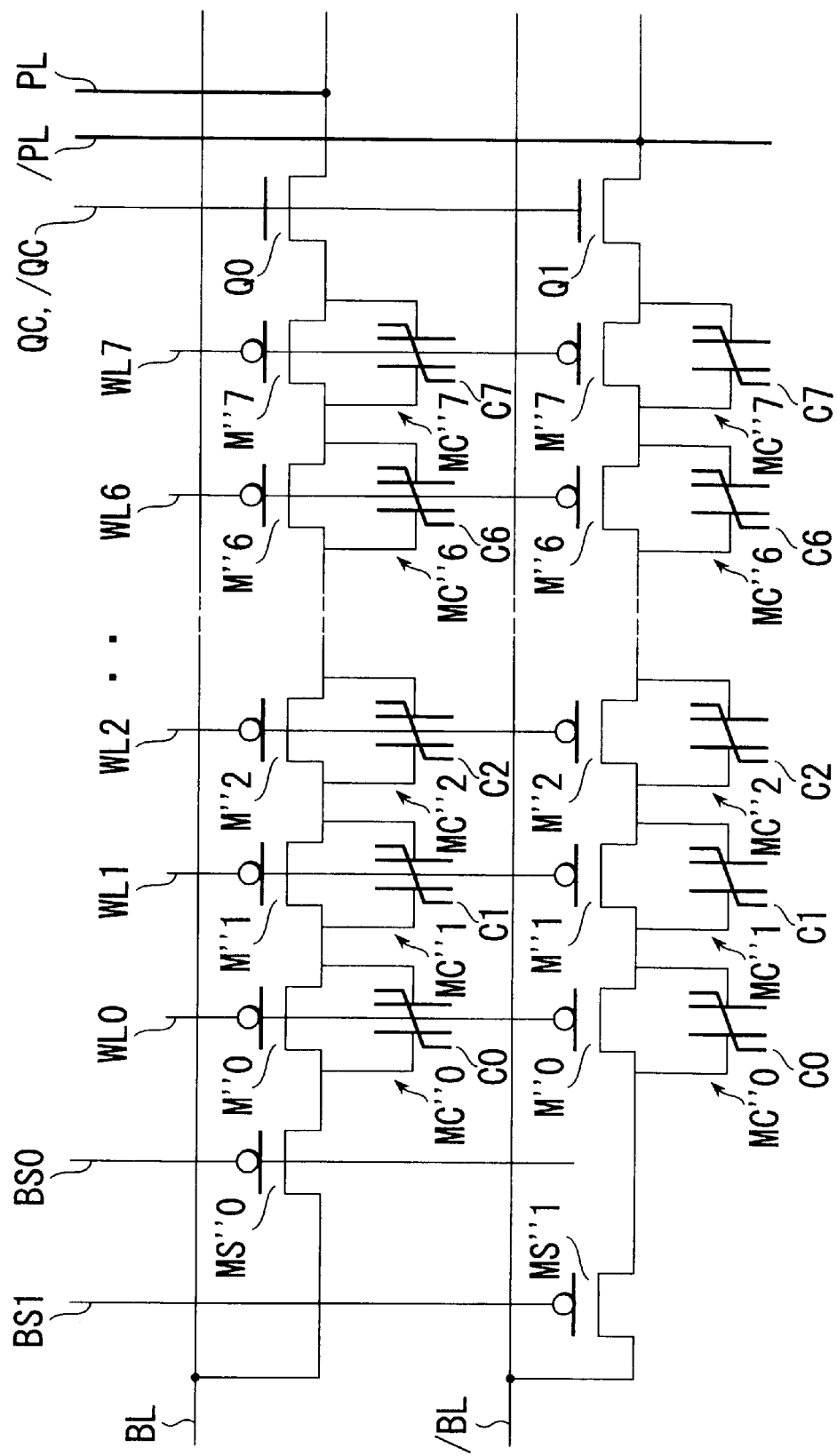
FIG. 10 is a circuit configuration showing an exemplary cell structure of a TC parallel unit serial connection type ferroelectric memory device according to an eighth embodiment of the present invention.

FIG. 10 shows an exemplary configuration (cell structure) of a TC parallel unit serial connection type ferroelectric memory device according to an eighth embodiment of the present invention. Hereinafter, a description will be given with respect to a case in which the above described invention according to the fourth embodiment is combined with that according to the fifth embodiment.

In the case of TC parallel unit serial connection type ferroelectric memory device, in each of the memory cells MC"0 to MC"7, the electrodes at both ends of the ferroelectric capacitors (cell capacitors) C0 to C7 are each configured to be coupled to the source and drain of the PMOS transistors M"0 to M"7, respectively. In addition, the plurality of memory cells MC"0 to MC"7 are coupled in series, and TC parallel unit serial connection type cells are configured, respectively. Further, cells MC"0 and MC"0 each at one end of a respective one of the TC parallel unit serial connection type cells are coupled to the bit lines BL and /BL via a respective one of the MOS switches MS"0 and MS"1 including PMOS transistors. In addition, the cells MC"7 and MC"7, each at the respective other end are coupled to cell plate drive lines PL and /PL via a respective one of the NMOS transistors (protective transistors) Q0 and Q1.

With such a configuration, the advantageous effects fifth embodiment can be expected. Therefore, even if static electricity is applied from the outside when power is turned OFF, a high voltage is impeded from being applied to cell capacitors (ferroelectric capacitors C0 to C7) more efficiently.

With such a configuration, the thresholds of the MOS switches MS"0 and MS"1 and the NMOS transistors Q0 and Q1 are set to be higher than those of any other transistor. In this way, it may be hard to set an ON state. In such a case, even if a high potential is induced by the bit lines BL and /BL or cell plate drive lines PL and /PL, the possibility that a voltage is applied to cell capacitors C0 to C7 can be lowered more significantly.

(Ninth Embodiment)

Figure 11:
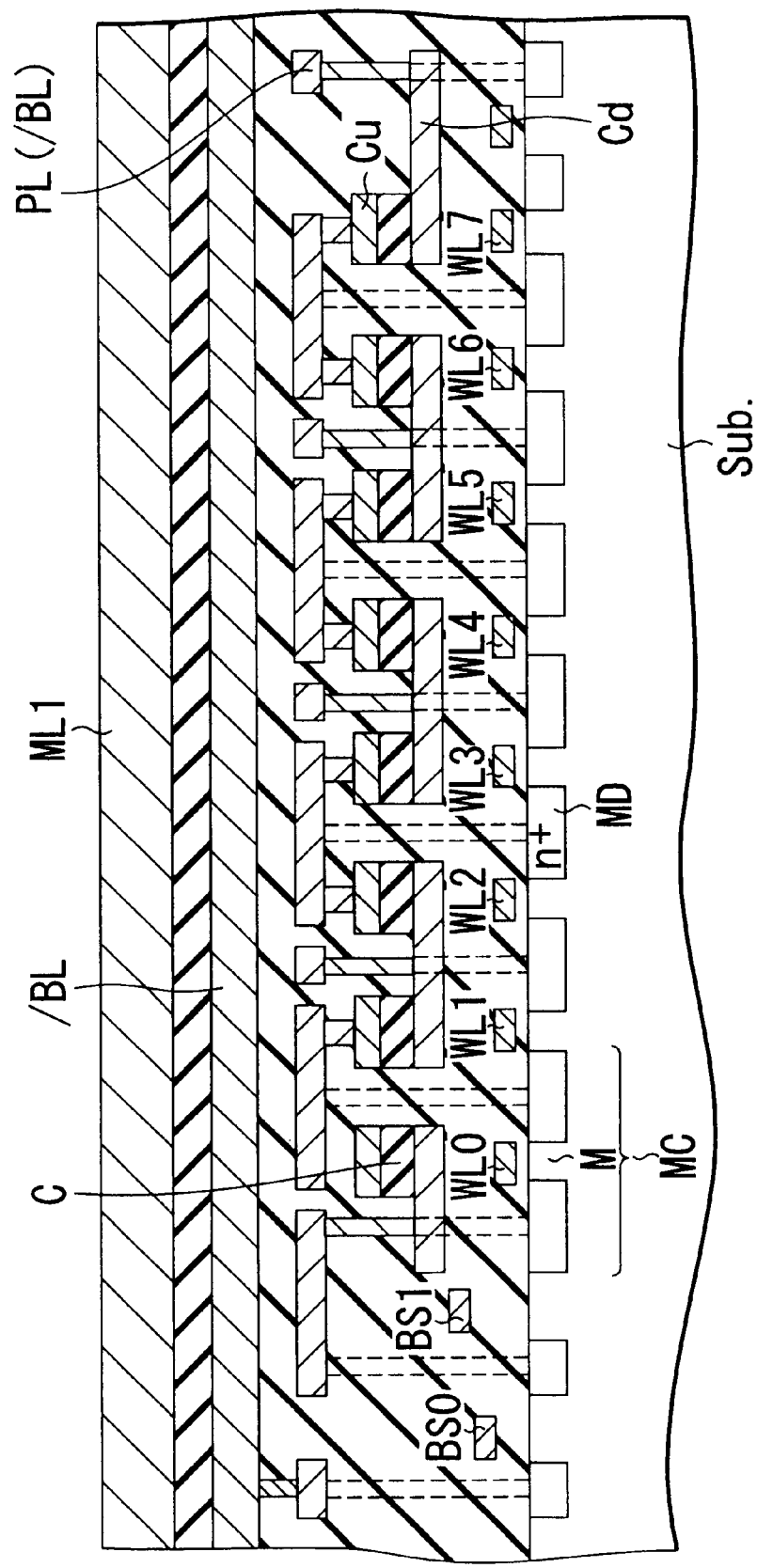
FIG. 11 is a sectional view showing an exemplary configuration of a TC parallel unit serial connection type ferroelectric memory device according to a ninth embodiment of the present invention.

FIG. 11 shows an exemplary configuration of a TC parallel unit serial connection type ferroelectric memory device according to a ninth embodiment of the present embodiment. In the figure, there is shown a sectional structure of the TC parallel unit serial connection type ferroelectric memory device.

In the case of TC parallel unit serial connection type ferroelectric memory device, each memory cell MC is configured so that a cell transistor M including an NMOS transistor is arranged at the downward part of a cell capacitor C employing a ferroelectric film. A scattering layer ($n^+$) MD of the source or drain of the cell transistor M is coupled to a cell plate drive line PL (bit line /BL). The cell plate drive lines PL (bit line /BL) are brought into contact with an upper electrode Cu or a lower electrode Cd of a cell capacitor C. The bit lines BL are arranged to be shifted by a half pitch in a direction of word line WL between these memory cells MC.

In such a configuration, a metal layer (electrostatic barrier layer) ML1 is further provided at the top layer of a chip, for example. In this manner, even if static electricity is applied from the outside of the chip when power is turned OFF, the cell plate drive lines PL and /PL can be impeded from being induced by way of static electricity. Moreover, in the case where the metal layer ML1 is brought into contact with a semiconductor substrate Sub. (or a well region not shown) at the outer periphery of the chip, its advantageous effect can be further improved.

(Tenth Embodiment)

Figure 12:
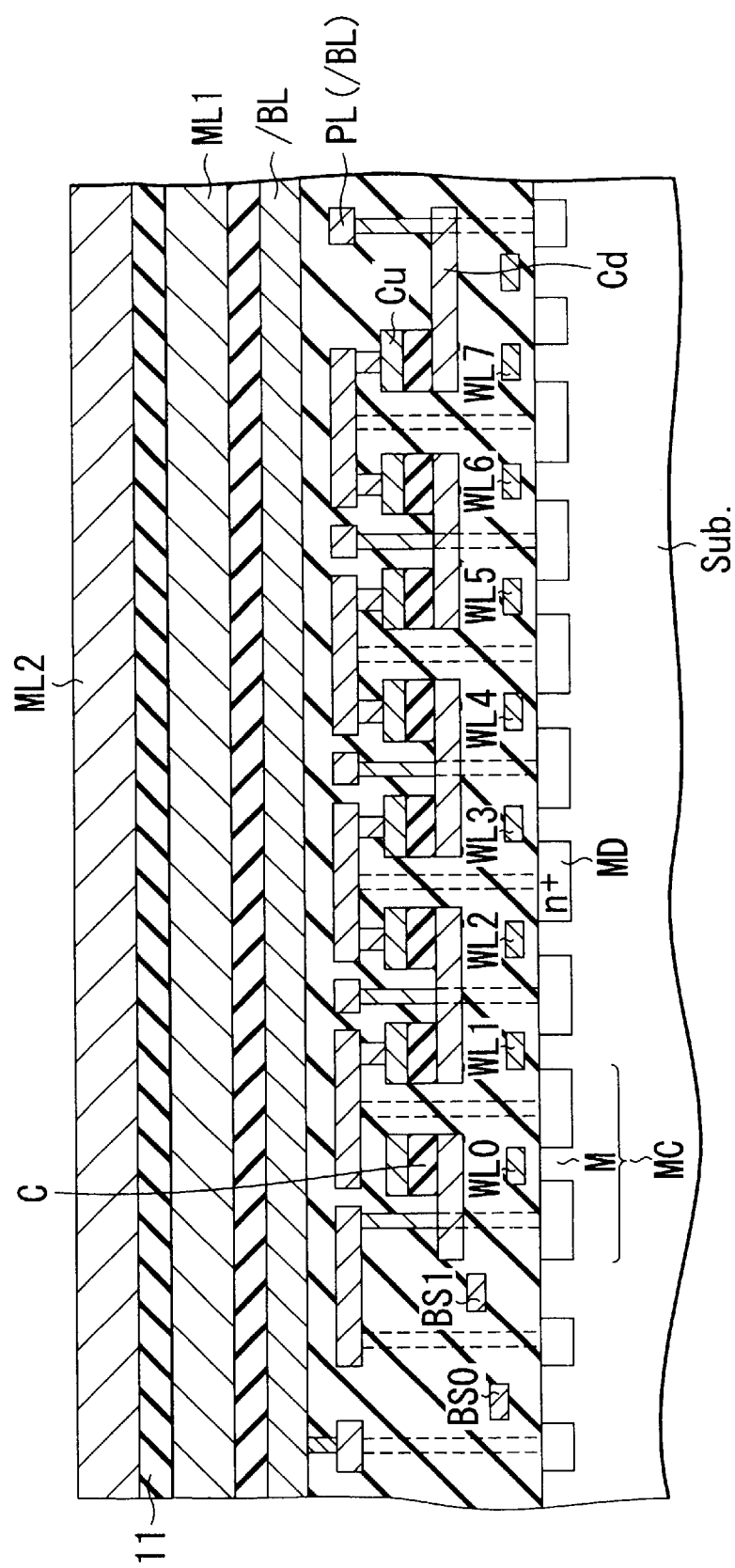
FIG. 12 is a sectional view showing an exemplary configuration of a TC parallel unit serial connection type ferroelectric memory device according to a tenth embodiment of the present invention.

FIG. 12 shows an exemplary configuration of a TC parallel unit serial connection type ferroelectric memory device according to a tenth embodiment of the present invention. In the figure, there is shown a sectional structure of a TC parallel unit serial connection type ferroelectric memory device.

This TC parallel unit serial connection type ferroelectric memory device is configured so that a metal layer (electrostatic barrier layer) ML2 is provided in a blanket manner via an insulation film 11 that is formed over the metal layer ML1 in the above described TC parallel unit serial connection type ferroelectric memory device shown in FIG. 11.

Figure 13:
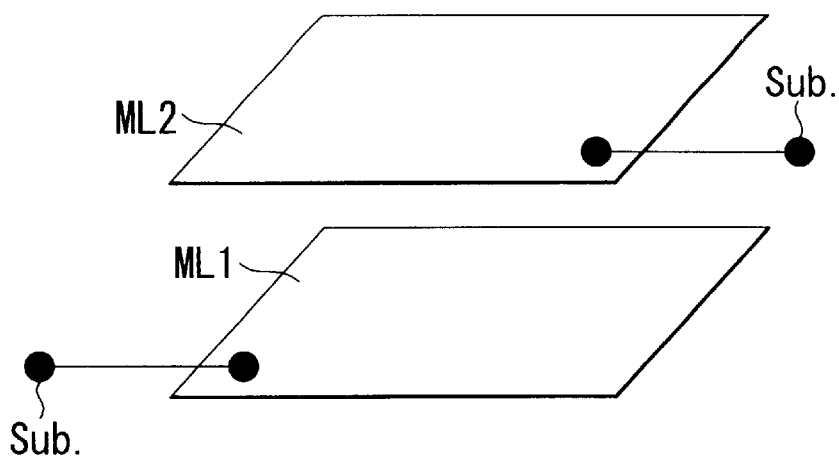
FIG. 13 is a view showing an exemplary connection of a metal layer employed in the TC parallel unit serial connection type ferroelectric memory device shown in FIG. 12.

In such a configuration, for example, as shown in FIG. 13, metal layers ML1 and ML2 each are brought into contact with a semiconductor substrate Sub. (or well region).

Figure 14:
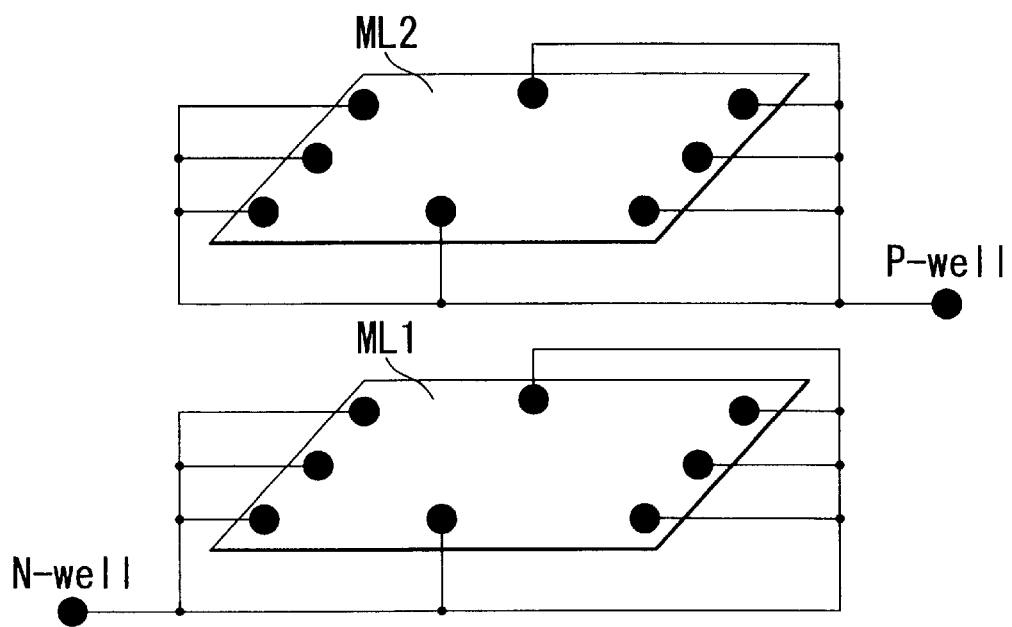
FIG. 14 is a view showing another exemplary connection of a metal layer employed in the TC parallel unit serial connection type ferroelectric memory device shown in FIG. 12.

In addition, as shown in FIG. 14, either one of the metal layers ML1 and ML2 (for example, metal layer ML1) is coupled to an N-well, and the other (for example, metal layer ML2) is coupled to a P-well. In this case, the metal layers ML1 and ML2 can be used as power lines. Therefore, a power line width on a chip can be reduced, which is efficient in reducing the chip area. Preferably, all eight points between four corners and middle points of four sides in the metal layers ML1 and ML2 are coupled to an N-well or P-well, respectively. In this manner, a resistance between an N-well or P-well and each of the metal layers ML1 and ML2 can be reduced, and a potential is stabilized.

Figure 15:
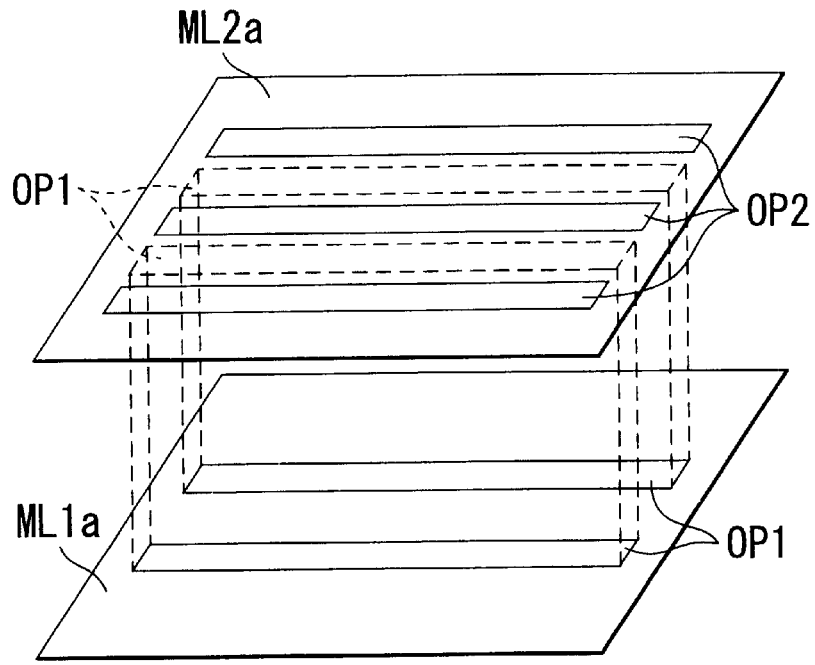
FIG. 15 is a view showing an exemplary configuration of a metal layer employed in the TC parallel unit serial connection type ferroelectric memory device shown in FIG. 12.
Figure 16:
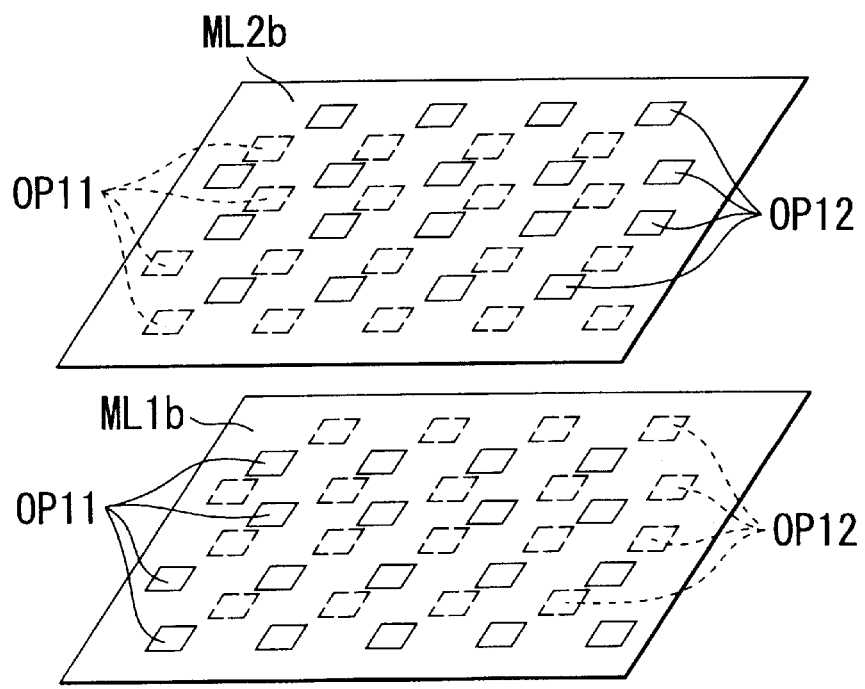
FIG. 16 is a view showing another exemplary configuration of a metal layer employed in the TC parallel unit serial connection type ferroelectric memory device shown in FIG. 12.
Figure 17:
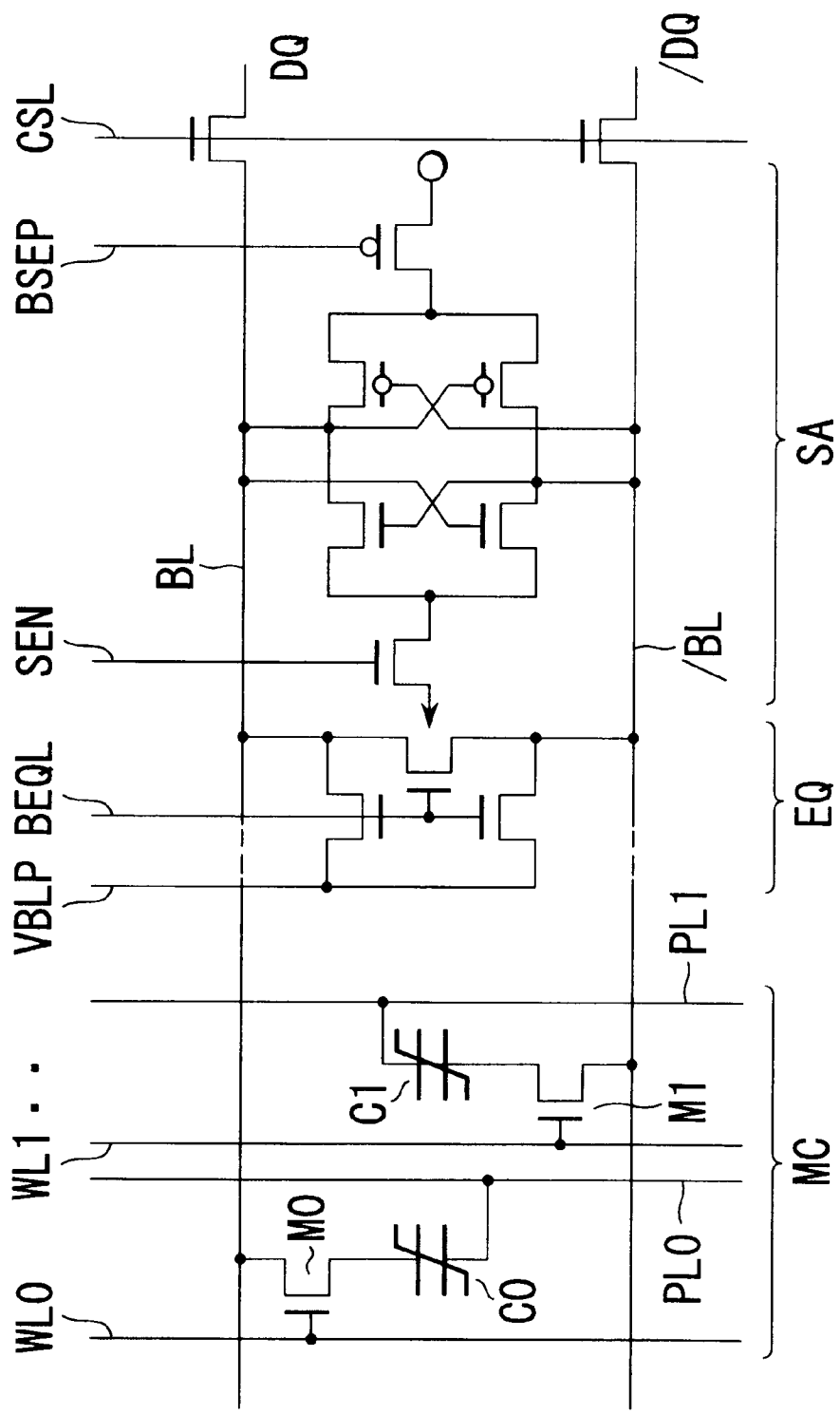
FIG. 17 is a circuit diagram showing an exemplary configuration of a conventional ferroelectric memory device having a 2T2C type cell structure.
Figure 18:
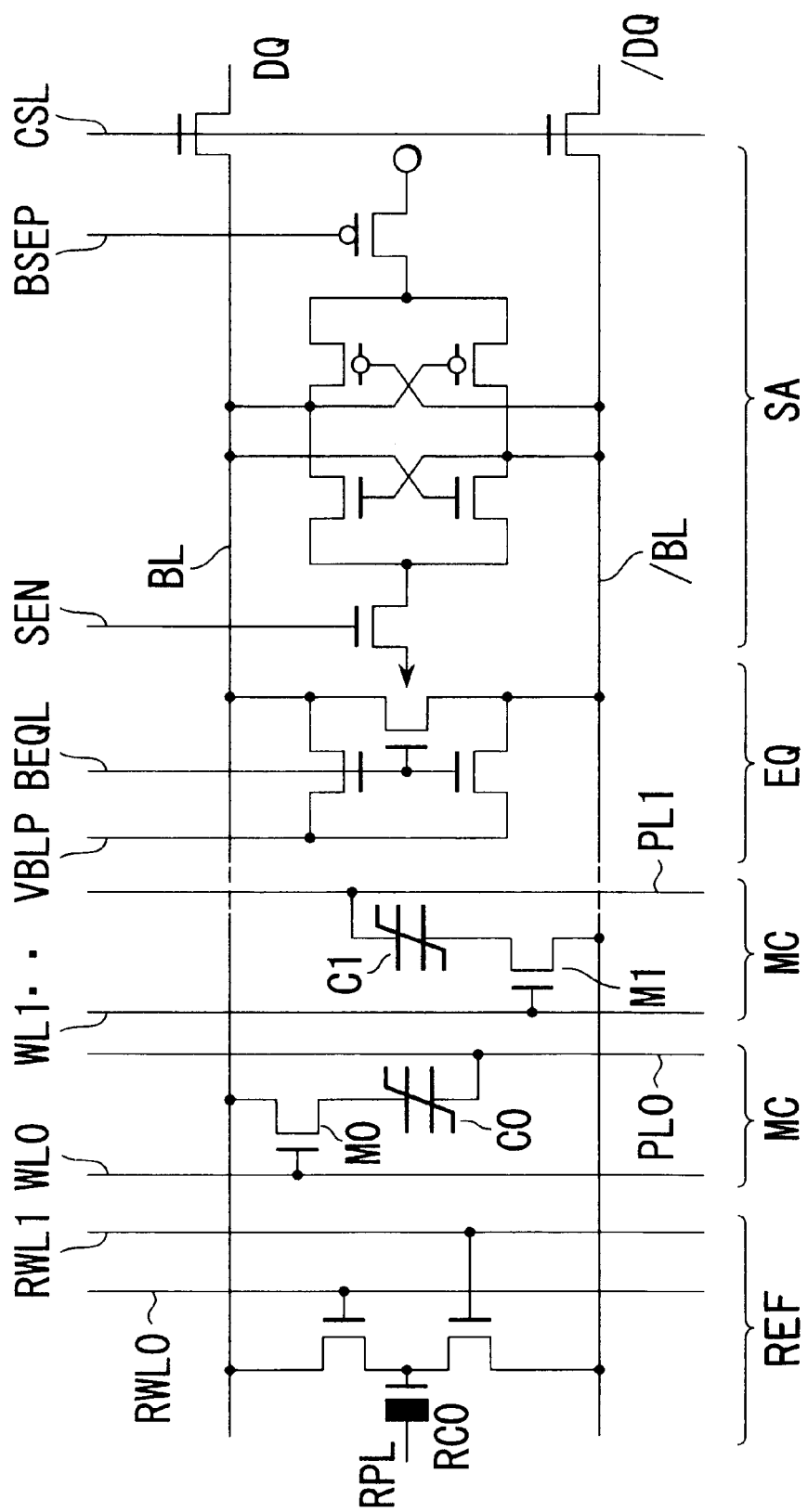
FIG. 18 is a circuit diagram showing an exemplary configuration of a conventional ferroelectric memory device having a 1T1C type cell structure.
Figure 19:
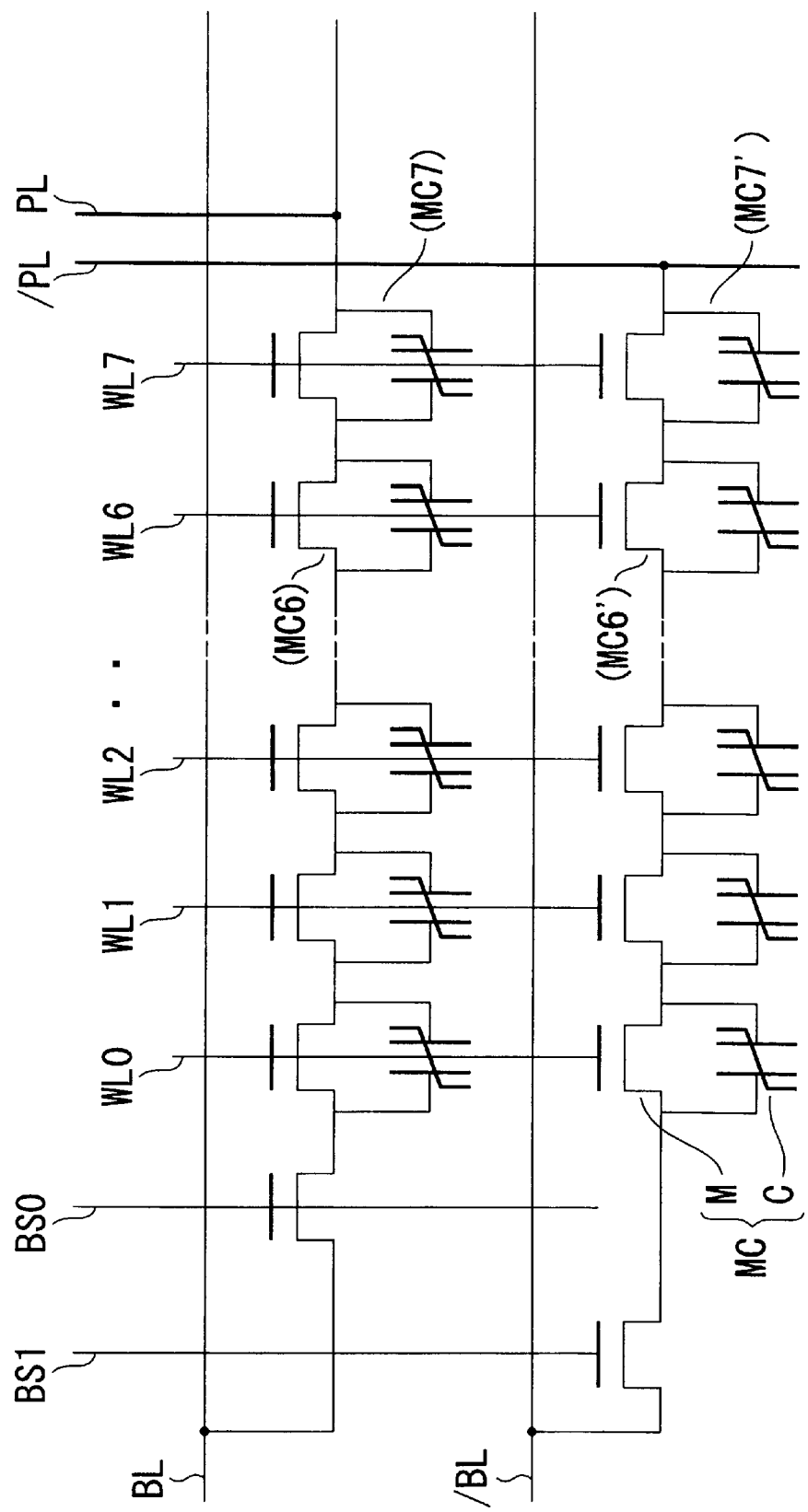
FIG. 19 is a circuit configuration showing an exemplary cell structure of a conventional TC parallel unit serial connection type ferroelectric memory device.

FIGS. 15 and 16 each show an exemplary configuration of a metal layer employed for the above described TC parallel unit serial connection type ferroelectric memory device. Now, a description will be given with respect to a case in which the stress of the metal layer is absorbed by forming an opening.

In FIG. 15, a plurality of slit-shaped openings OP1 and OP2 are provided at the metal layers ML1a and ML2a, respectively. In particular, in the case where the metal layer is formed of two layers, these two layers are shifted in their positions so that the position of opening OP1 on the lower metal layer ML1a does not overlap that of the opening OP2 on the upper metal layer ML2a.

In FIG. 16, a plurality of rectangular (or circular) openings OP11 and OP12 are provided at the metal layers ML1b and ML2b, respectively. In this case as well, in the case where the metal layer is formed of two layers, these two layers are shifted in their positions so that the position of the opening OP11 on the lower metal layer ML1b does not overlap that of the opening OP12 on the upper metal layer ML2b.

In the above configurations, an electric force line that causes electrostatic induction while reducing a stress can be efficiently interrupted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory device comprising:
    a word line;
    first and second bit lines cross to said word line;
    a memory cell including a first transistor a gate of which is coupled to said word line and one of source and drain of which is coupled to said first bit line, a second transistor a gate of which is coupled to said word line and one of source and drain of which is coupled to said second bit line, and a ferroelectric cell capacitor coupled to the other of source and drain of said first and second transistor; and
    first and second capacitors each coupled via a switching transistor to a respective one of said first and second bit lines;
    wherein first and second voltages complementary to each other are applied to said first and second bit lines, via said first and second capacitors, respectively.

2. The ferroelectric memory device according to claim 1, wherein said first and second bit lines compose a pair of bit lines.

3. The ferroelectric memory device according to claim 1, wherein said first and second capacitors each are ferroelectric capacitors.

4. The ferroelectric memory device according to claim 1, wherein said first and second capacitors are ordinary dielectric capacitors.

5. The ferroelectric memory device according to claim 1, wherein said first and second capacitors have a film thickness greater than a film thickness of said ferroelectric cell capacitor.

6. A ferroelectric memory device comprising:
    a plurality of word lines;
    first and second bit lines cross to said plurality of word lines;
    cell blocks each including a plurality of memory cells in series and each including a plurality of transistors whose gate is coupled to a respective one of said plurality of word lines, and a plurality of ferroelectric cell capacitors each coupled between a source and drain of a respective one of said plurality of transistors, a first end of the series-coupled memory cells being coupled to said first bit line, and a second end thereof being coupled to said second bit line; and
    first and second capacitors coupled to said first and second bit lines, respectively, via a switching transistor, wherein said first and second capacitors are ferroelectric capacitors and have a film thickness greater than a film thickness of said ferroelectric cell capacitors, and
    wherein first and second voltages complementary to each other are applied to said first and second bit lines via said first and second capacitors, respectively.

7. A ferroelectric memory device comprising a plurality of memory cells coupled in series and including a plurality of cell transistors whose gate is coupled to a respective one of a plurality of word lines and a plurality of ferroelectric cell capacitors each coupled between a source and drain of a respective one of said plurality of cell transistors, and
    wherein a first end of said plurality of memory cells is coupled to a bit line via a select transistor, a threshold of said select transistor is set to be higher than a threshold of said plurality of cell transistors, and a second end of said plurality of memory cells is coupled to a plate line,
    said plurality of cell transistors being configured by a depression type NMOS transistor.

8. A ferroelectric memory device comprising a plurality of memory cells coupled in series and including a plurality of cell transistors whose gate is coupled to a respective one of a plurality of word lines and a plurality of ferroelectric cell capacitors each coupled between a source and drain of a respective one of said plurality of cell transistors, and
    wherein a first end of said plurality of memory cells is coupled to a bit line, and a second end thereof is coupled to a plate line via a protective transistor whose threshold is set to be higher than a threshold of said plurality of cell transistors,
    said plurality of cell transistors being configured by a depression type NMOS transistor.

9. A ferroelectric memory device comprising a plurality of memory cells coupled in series and including a plurality of cell transistors whose gate is coupled to a respective one of a plurality of word lines and a plurality of ferroelectric cell capacitors each coupled between a source and drain of a respective one of said plurality of cell transistors, and
    wherein a first end of said plurality of memory cells is coupled to a bit line via a select transistor whose threshold is set to be higher than a threshold of said plurality of cell transistors, and a second end of said plurality of memory cells is coupled to a plate line,
    said plurality of cell transistors being configured by a PMOS transistor.

10. A ferroelectric memory device comprising a plurality of memory cells coupled in series and including a plurality of cell transistors whose gate is coupled to a respective one of a plurality of word lines and a plurality of ferroelectric cell capacitors each coupled between a source and drain of a respective ones said plurality of cell transistors, and
    wherein a first end of said plurality of memory cells is coupled to a bit line, and a second end thereof is coupled to a plate line via a protective transistor whose threshold is set to be higher than a threshold of said plurality of cell transistors,
    said plurality of cell transistors being configured by a PMOS transistor.

11. A ferroelectric memory device comprising:

a memory cell including a cell transistor and a ferroelectric cell capacitor coupled to said cell transistor, a first end of said memory cell being coupled to a bit line and a second end thereof is coupled to a plate line;

a protective transistor provided between the second end of said memory cell and said plate line; and a select transistor is provided between the first end of said memory cell and said bit line, a threshold of said cell transistor being set lower than a threshold of said select transistor.

12. A ferroelectric memory device comprising:

a memory cell including a cell transistor and a ferroelectric cell capacitor coupled to said cell transistor, a first end of said memory cell being coupled to a bit line and a second end thereof is coupled to a plate line; and a protective transistor provided between the second end of said memory cell and said plate line, wherein a threshold of said cell transistor is set to be lower than a threshold of said protective transistor.

13. A ferroelectric memory device comprising:

a memory cell including a cell transistor and a ferroelectric cell capacitor coupled to said cell transistor, a first end of said memory cell being coupled to a bit line and a second end thereof is coupled to a plate line; and a protective transistor provided between the second end of said memory cell and said plate line, wherein said bit line is arranged in a direction parallel to said plate line.

14. A ferroelectric memory device comprising:

a plurality of memory cells coupled in series and including a plurality of cell transistors whose gate is coupled to a respective one of a plurality of word lines and a plurality of ferroelectric cell capacitors each coupled between a source and drain of a respective one of said plurality of cell transistors, a first end of said plurality of memory cells being coupled to a bit line and a second end thereof being coupled to a plate line;

a protective transistor provided between the second end of said plurality of memory cells and said plate line; and a select transistor provided between the first end of said plurality of memory cells and said bit line, wherein a threshold of said plurality of cell transistors is set to be lower than a threshold of said select transistor.

15. A ferroelectric memory device comprising:

a plurality of memory cells coupled in series and including a plurality of cell transistors whose gate is coupled to a respective one of a plurality of word lines and a plurality of ferroelectric cell capacitors each coupled between a source and drain of a respective one of said plurality of cell transistors, a first end of said plurality of memory cells being coupled to a bit line and a second end thereof being coupled to a plate line;

a protective transistor provided between the second end of said plurality of memory cells and said plate line; and wherein a threshold of said plurality of cell transistors is set to be lower than a threshold of said protective transistor.

16. A ferroelectric memory device comprising:

a plurality of memory cells coupled in series and including a plurality of cell transistors whose gate is coupled to a respective one of a plurality of word lines and a plurality of ferroelectric cell capacitors each coupled between a source and drain of a respective one of said plurality of cell transistors, a first end of said plurality of memory cells being coupled to a bit line and a second end thereof being coupled to a plate line;

a protective transistor provided between the second end of said plurality of memory cells and said plate line; and wherein said bit line is arranged in a direction parallel to said plate line.

17. A ferroelectric memory device, comprising a plurality of memory cells coupled in series and including a plurality of cell transistors whose gate is coupled to a respective one of a plurality of word lines and a plurality of ferroelectric cell capacitors coupled between the source and drain of said plurality of cell transistors, respectively, and wherein one end of said plurality of memory cells is coupled to a bit line, and the other end thereof is coupled to a plate line, an electrostatic barrier layer including an electrically conductive layer provided above said plurality of ferroelectric cell capacitor.

18. The ferroelectric memory device according to claim 17, wherein said electrostatic barrier layer is provided in a blanket.

19. The ferroelectric memory device according to claim 17, wherein an opening is provided at said electrostatic barrier layer.

20. The ferroelectric memory device according to claim 17, wherein said electrostatic barrier layer is brought into contact with a semiconductor substrate or a well region.

21. A ferroelectric memory device, comprising a plurality of memory cells coupled in series and including a plurality of cell transistors whose gate is coupled to a respective one of a plurality of word lines and a plurality of ferroelectric cell capacitors coupled between the source and drain of said plurality of cell transistors, respectively, and wherein one end of said plurality of memory cells is coupled to a bit line, and the other end thereof is coupled to a plate line, a plurality of electrostatic barrier layers each including an electrically conductive layer and provided above said plurality of ferroelectric cell capacitors.

22. The ferroelectric memory device according to claim 21, wherein said plurality of electrostatic barrier layers are provided in a blanket.

23. The ferroelectric memory device according to claim 21, wherein openings are provided at said plurality of electrostatic barrier layers.

24. The ferroelectric memory device according to claim 23, wherein said plurality of electrostatic barrier layers are provided so that said openings do not overlap with each other in a vertical direction, respectively.

25. The ferroelectric memory device according to claim 21, wherein said plurality of electrostatic barrier layers are brought into contact with a semiconductor substrate or a well region.

* * * * *